United States Patent
Inokuchi et al.

(10) Patent No.: US 6,294,801 B1
(45) Date of Patent: Sep. 25, 2001

(54) SEMICONDUCTOR DEVICE WITH SCHOTTKY LAYER

(75) Inventors: Kazuyuki Inokuchi; Seiichi Takahashi; Shinichi Hoshi; Tadashi Saito; Nobusuke Yamamoto; Yuko Itoh; Nobumasa Higemoto, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/296,496

(22) Filed: Apr. 22, 1999

(30) Foreign Application Priority Data

May 1, 1998 (JP) .................................. 10-122107
Nov. 2, 1998 (JP) .................................. 10-312063

(51) Int. Cl.[7] .................. H01L 31/072; H01L 31/109; H01L 31/0328; H01L 31/0336
(52) U.S. Cl. ..................... 257/192; 257/194; 257/195; 438/172
(58) Field of Search ......................... 257/192, 194, 257/195; 438/172

(56) References Cited

U.S. PATENT DOCUMENTS

| | | | |
|---|---|---|---|
| 4,424,525 | * 1/1984 | Mimura | 357/23 |
| 5,043,777 | * 8/1991 | Sriram | 357/22 |
| 5,250,822 | * 10/1993 | Sonoda et al. | 257/194 |
| 5,391,899 | * 2/1995 | Kohno | 257/192 |
| 6,078,067 | * 6/2000 | Oikawa | 257/192 |

OTHER PUBLICATIONS

Breech et al., "Optimization of Pseudomorphic HEMT's Supported by Numerical Simulations," IEEE Transactions on Electron Devices, vol. 44, No. 11, Nov. 1997, pp. 1822–1828.*

Lee et al., "Ultra Low Noise Characteristics of AlGaAs/InGaAs/GaAs Pseudomorphic HEMT's with Wide T–Shaped Gate", IEEE Electron Device Letters, vol. 16, No. 6, Jun. 1995, pp. 271–273.*

Kohji Matsunaga et al., "High power pseudomorphic double–heterojunction field effect transistors with 26V gate–drain breakdown voltages," Inst. Phys. Conf. Chapter 9, pp. 749–754.

* cited by examiner

*Primary Examiner*—William Mintel
(74) *Attorney, Agent, or Firm*—Jones Volentine, PLLC

(57) ABSTRACT

A semiconductor device includes a Schottky layer, a cap layer covering the surface of the Schottky layer, and a Schottky electrode of a two-level structure. The Schottky electrode has a lower portion that penetrates through the cap layer and reaches the Schottky layer, and has an upper portion larger than the lower portion in cross-sectional area and that overlies the cap layer. With this construction, surface defects are unlikely to occur, so that a highly reliable semiconductor device can be fabricated.

33 Claims, 30 Drawing Sheets

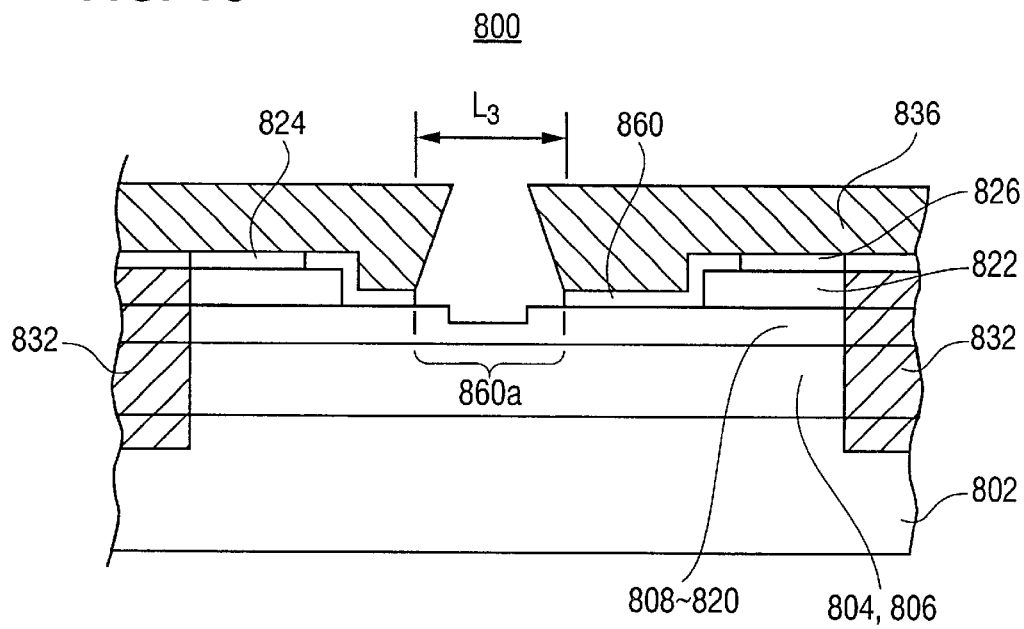
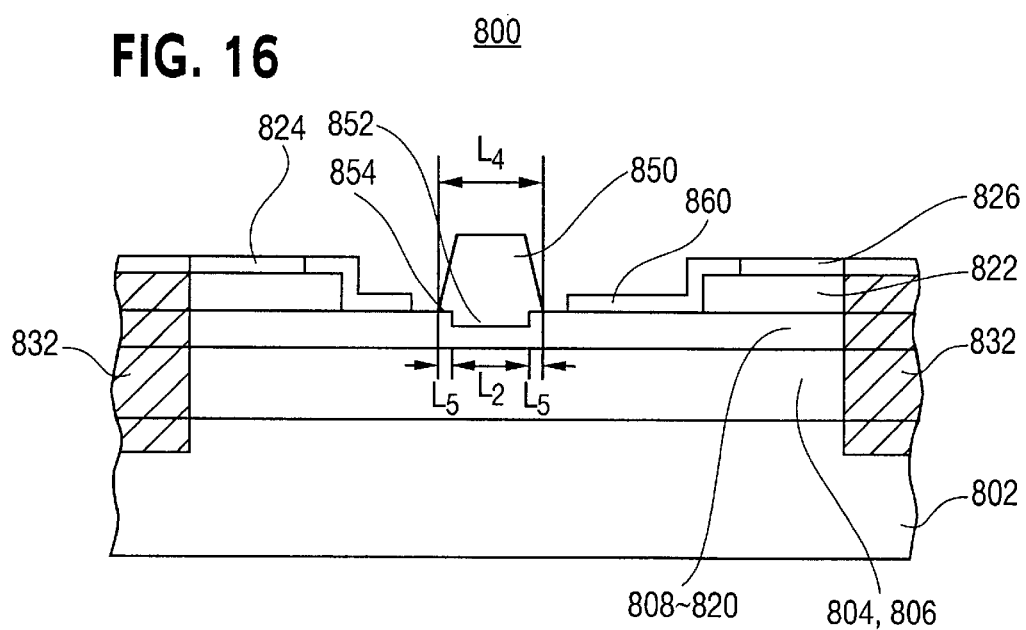

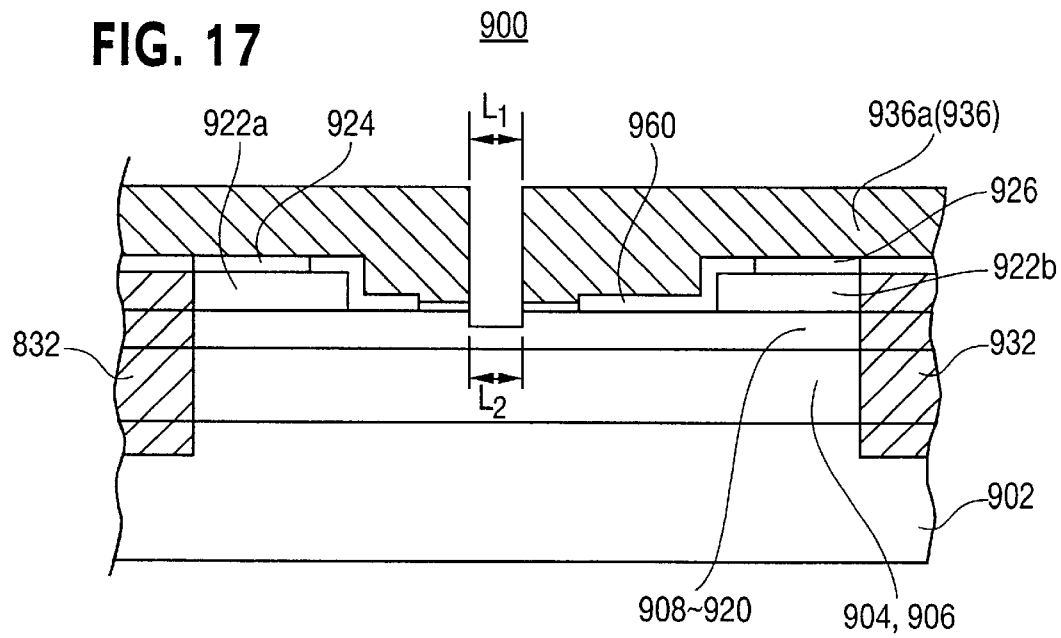
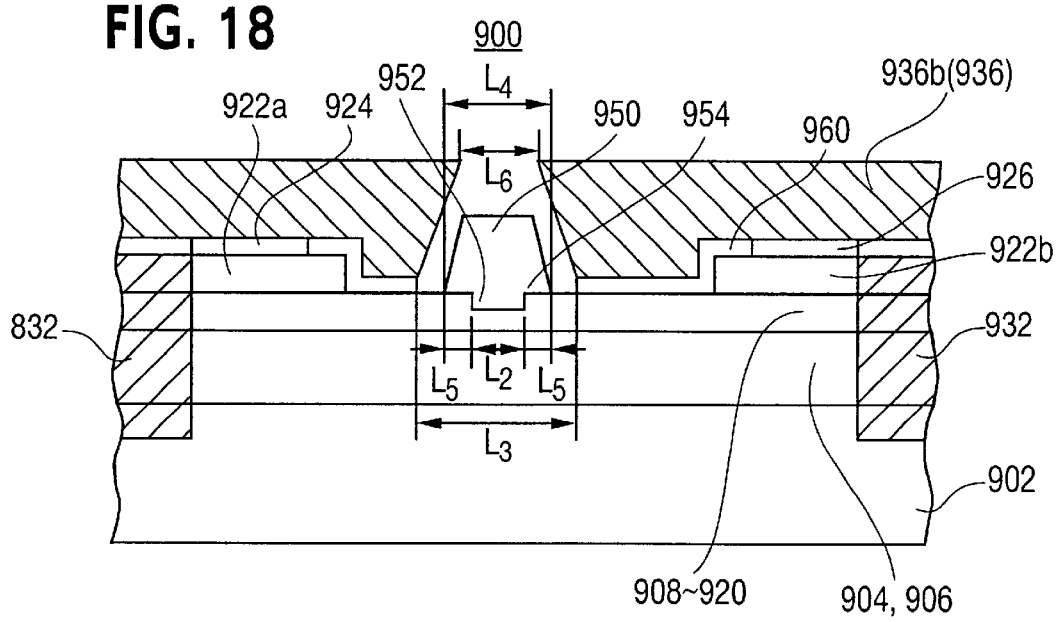

2000

2040

2000

SEMICONDUCTOR DEVICE WITH SCHOTTKY LAYER

BACKGROUND OF THE INVENTION

1. Field of the Invention

The invention relates to a semiconductor device and a process of fabricating the same, and more particularly, to a structure of a semiconductor device such as a field-effect transistor, and the like, having a Schottky electrode, and a process of fabricating the structure.

2. Description of the Related Art

A field-effect transistor (referred to hereinafter as FET) using a compound semiconductor has been well known, and among FETs, attention has since been drawn to a double-hetero (DH) junction type high electron mobility field-effect transistor (referred to hereinafter as HEMT) as a device capable of gaining high output and high efficiency characteristic. Such a HEMT has been described in, for example, a paper under the title of "High Power Pseudomorphic Double-heterojunction Field Effect Transistors With 26V Gate-drain Breakdown Voltages", by K. Matsunaga, N. Iwata, and M. Kuzuhara, Inst. Phys. Conf. Ser. No. 129, Chapter 9, pp. 749–754 (1992).

Further, among HEMTs, there has been well known a HEMT fabricated by combining a substrate composed of gallium arsenide (GaAs) with a channel layer composed of indium gallium arsenide (InGaAs). The HEMT of such a structure is called a pseudomorphic HEMT (referred to hereinafter as PHEMT) because it has a structure incorporating the channel layer composed of indium galliim arsenide (InGaAs) having a crystal lattice warped due to the lattice constant thereof being different from that of gallium arsenide (GaAs) used for the substrate. In the PHEMT, n-type aluminum gallium arsenide (AlGaAs) is used for an electron supply layer for supplying electrons into a potential well in the channel layer, and AlGaAs without any dopant ($\Phi$) implanted is used for a Schottky layer to raise a height of the Schottky barrier of a gate electrode.

SUMMARY OF THE INVENTION

It is an object of the invention to provide a high reliable, novel, and improved semiconductor device as well as a process of fabricating the same by covering the surface of a chemically active Schottky layer with a chemically stable cap layer, and by embedding a gate electrode in a region where coveting of the Schottky layer with the cap layer tends to become imperfect, so that aluminum atoms existing in the surface of $\Phi^-$AlGaAs composing the Schottky layer are prevented from bonding with elements in air, and materials and impurities, adhered thereto, during a fabrication process, and from resultantly forming a deep level having electrical effect in a forbidden band, thereby lessening a risk of surface defect, and resulting in a high reliability and high yield.

Another object of the invention is to provide a novel, and improved semiconductor device such as a PHEMT, having a high cut-off frequency fT, and a process of fabricating same by forming a Schottky electrode so as to render a bottom surface area thereof, facing two-dimensional electron gas in a channel layer, smaller, so that high mutual conductance gm, and low capacitance Cgs between a gate and a source can be obtained.

Still another object of the invention is to provide a novel, and improved semiconductor device such as a PHEMT, having a high cut-off frequency fT, and a process of fabricating same by obtaining high mutual conductance gm, and low capacitance Cgs between a gate and a source without deteriorating the characteristic of high breakdown voltage between the gate and the drain.

It is a further object of the invention to provide a novel and improved semiconductor device, and a process of fabricating same, wherein the characteristics of the semiconductor device can be optimized after fabricating a gate electrode, a source electrode, and a drain electrode into a wafer, thereby enhancing flexibility in designing a process of fabrication.

The semiconductor device according to the invention comprises a Schottky electrode having an under structure penetrating through the Schottky layer and the cap layer covering the Schottky layer and reaching the Schottky, layer, and having an upper structure larger than the under structure, in a cross-sectional area, and overlying the cap layer.

Further, various other aspects of the invention for attaining the objects described above are disclosed hereinafter, and will be apparent from the following detailed description of the preferred embodiments of the invention in conjunction with the accompanying drawings.

BRIEF DESCRIPTION OF THE DRAWINGS

FIG. 15 is a schematic illustration in section of a step of the process of fabricating the semiconductor device, according to the eighth embodiment of the invention;

FIG. 16 is a schematic illustration in section of a step of the process of fabricating the semiconductor device, according to the eighth embodiment of the invention;

FIG. 17 is a schematic illustration in section of a step of a process of fabricating a semiconductor device, according to a ninth embodiment of the invention;

FIG. 18 is a schematic illustration in section of a step of the process of fabricating the semiconductor device, according to the ninth embodiment of the invention;

DESCRIPTION OF THE PREFERRED EMBODIMENTS

Figure 1:
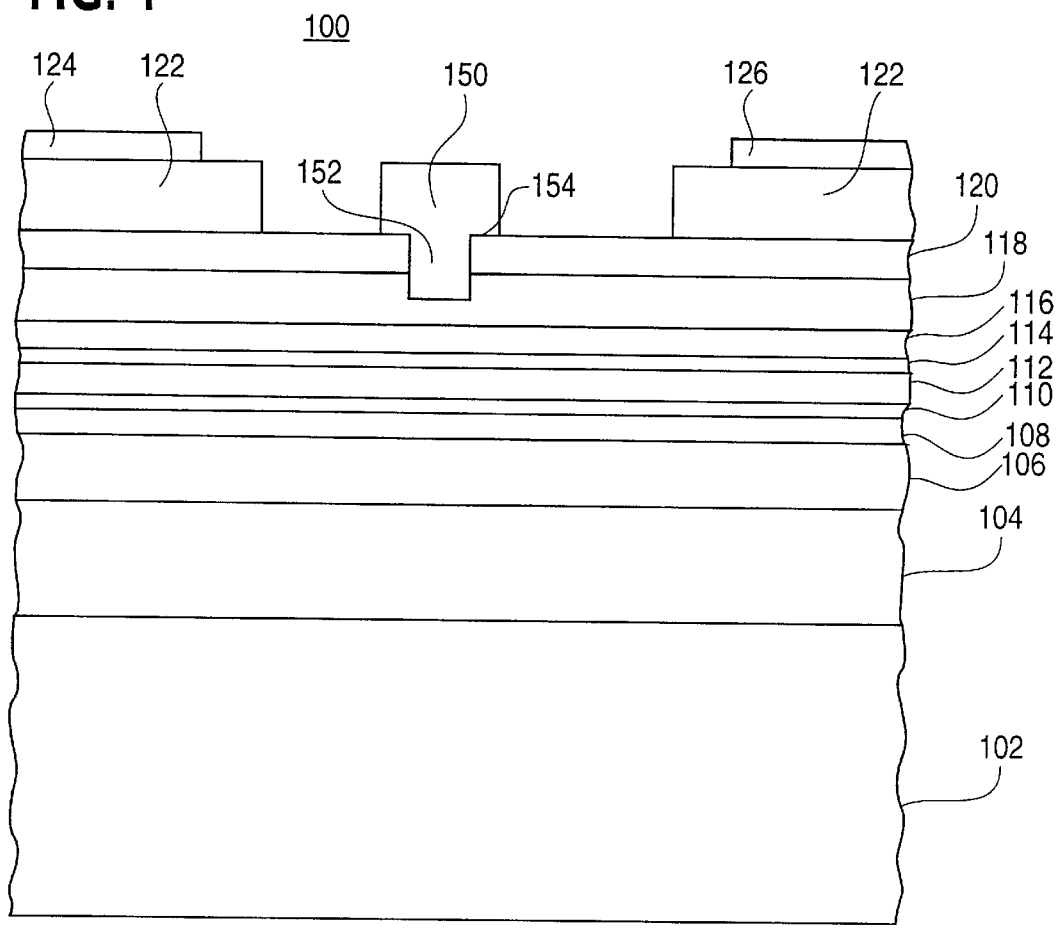
FIG. 1 is a schematic sectional view showing a structure of a PHEMT according to a first embodiment of the invention.

Preferred embodiments of a semiconductor device according to the invention as applied to a field-effect transistor are described in detail hereinafter with reference to the accompanying drawings. In the following description and the accompanying drawings, constituent members having substantially the same function and construction are denoted by similar reference numerals, thereby omitting duplicated explanation.

[First Embodiment]

FIG. 1 is a schematic sectional view showing a structure of a PHEMT 100 according to a first embodiment of the invention. As shown in the figure, the PHEMT 100 comprises a substrate 102, composed of semi-insulating GaAs, on top of which a fist buffer layer 104, composed of $\Phi^-$GaAs, a second buffer layer 106, composed of $\Phi^-$AlGaAs, a first electron supply layer 108, composed of $n^+$AlGaAs, a first spacer 110, composed of $\Phi^-$AlGaAs, a channel layer 112, composed of $\Phi^-$InGaAs, a second spacer 114, composed of $\Phi^-$AlGaAs, and a second electron supply layer 116, composed of $n^+$AlGaAs, are deposited in that order. Further, a Schottky layer 118, composed of $\Phi^-$AlGaAs, is formed to a thickness of about 500 angstroms on the second electron supply layer 116, and a cap layer 120, composed of GaAs at a donor density of about 3E 17 $cm^{-3}$, is formed to a thickness of about 250 angstroms on the Schottky layer 118.

Then, $n^+$layers 122 (refer to the figure), composed of $n^+$GaAs at a donor density of about 4E 18 $cm^{-3}$, are formed to a thickness of 1000 angstroms on the cap layer 120, in regions where ohmic electrodes are formed.

Further, on top of the n⁺layers 122, a first ohmic electrode 124 and a second ohmic electrode 126 are formed, respectively. The first ohmic electrode 124 shown on the left side in the figure is constructed to serve as a source electrode, and the second ohmic electrode 126 shown on the right side in the figure to serve as a drain electrode. Furthermore, a gate electrode 150, which is a Schottky electrode of the PHEMT 100 according to this embodiment, is formed between the source electrode 124 and the drain electrode 126.

As shown in the sectional view, the gate electrode 150 consists of an under structure and an upper structure, formed in steps. The under structure 152 in a stepped part thereof penetrates through the cap layer 120, reaching the Schottky layer 118. Further, the upper structure 154 is formed as if it was overlying the cap layer 120. In this embodiment, the stepped part of the gate electrode 150 can be formed such that a difference in level is, for example, on the order of 500 angstroms. Further, in this embodiment, the gate electrode 150 is set at offset towards the side of the source electrode 124. This is an attempt to reduce a source resistance and enhance a high breakdown voltage between the gate and the drain. In this embodiment, a spacing between the n⁺layer 122 on the side of the source and the gate electrode 150 is, for example, on the order of 0.6 µm. A spacing between the n⁺layer 122 on the side of the drain and the gate electrode 150 is, for example, on the order of 1.5 µm.

Figure 2:
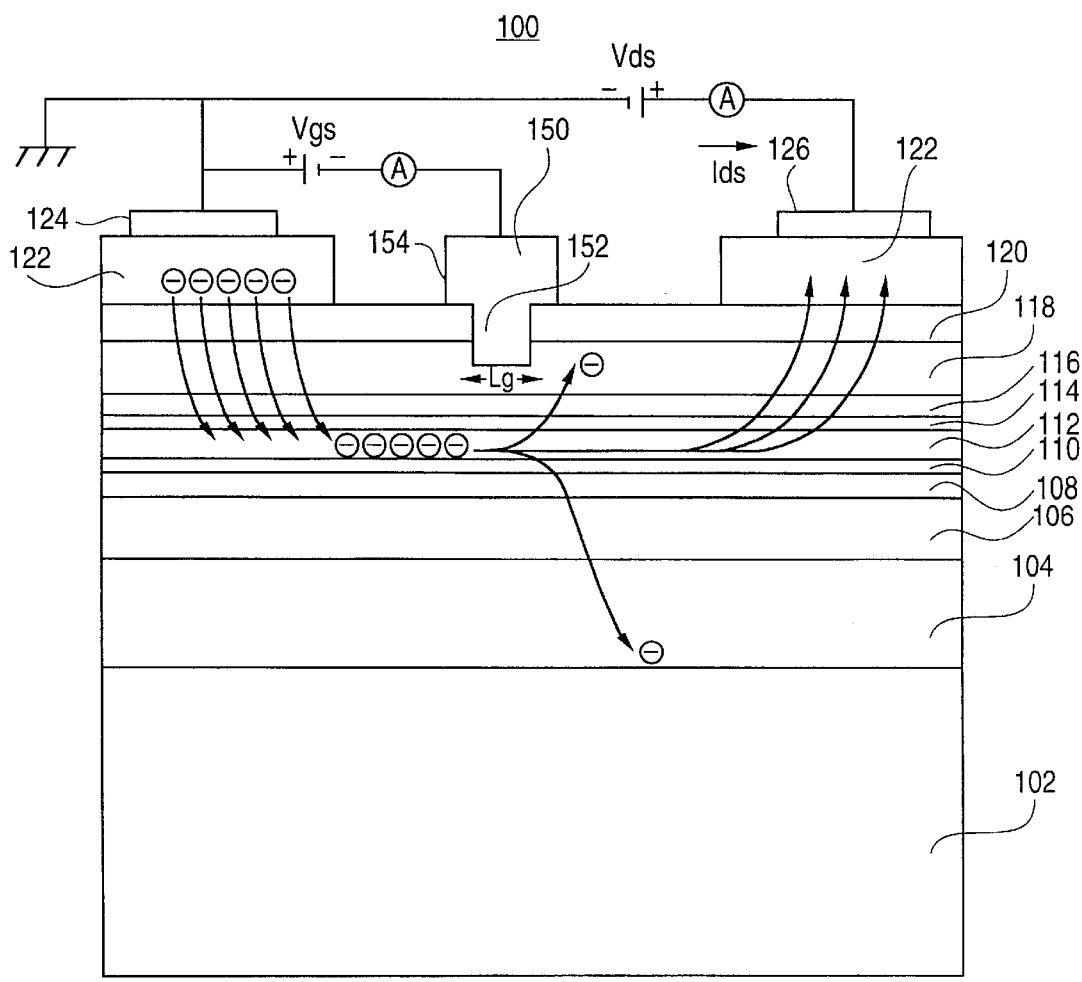
FIG. 2 is a schematic illustration showing the operation of the PHEMT shown in FIG. 1.

Next, the operation of the PHEMT 100 according to the first embodiment of the invention is described hereinafter with reference to FIG. 2. As shown in the figure, the PHEMT 100 has the source electrode 124 grounded. By applying a positive voltage (Vds) to the drain electrode 126, and a negative voltage (Vgs) to the gate electrode 150, operation such as oscillation and amplification can be performed. As shown in the figure, at the time of operation, electrons are supplied from the source electrode 124 to the channel layer 112. The electrons are accelerated by an electric field between the source and the drain, and will soon reach the saturation velocity. The electrons move through the channel layer 112 substantially at the saturation velocity, and reaches the drain electrode 126, generating a drain current (Ids). It can happen that portions of the electrons moving through the channel layer 112 at a high velocity leak into the substrate 102, or jump into the Schottky layer 118. If a deep energy level acting as an electron trap exists in a FET structure, these electrons are trapped therein, so that electric charge will be accumulated while the PHEMT 100 is in operation as a FET. This can cause a change in a threshold voltage Vth, mutual conductance gm, the drain current Ids, considerably impairing performance of the FET in a circuit. However, with the PHEMT 100 according to this embodiment, having the structure as described in the foregoing, the Schottky layer 118, composed of chemically unstable AlGaAs, is fully covered with the cap layer 120 which is a conduction layer, and consequently, a deep energy level caused by imperfection of the surface of the Schottky layer 118 does not occur. Accordingly, there will not occur deterioration of performance as described above.

Now, the upper limit of frequency of a FET in high frequency operation is generally expressed by a cut-off frequency fT represented by the following formula (1):

$$fT = gm/(2\pi Cgs) \tag{1}$$

where
  gm=mutual conductance, and
  Cgs=capacitance between the gate and the source.
The capacitance Cgs between the gate and the source is a sum of an electrostatic capacitance between the gate and the channel, same between the gate and the n⁺layer as well as the ohmic electrode, on the side of the source.

As is evident from the formula (1) described above, the capacitance Cgs between the gate and the source needs to be reduced in order to improve the high frequency characteristic of a FET. In this connection, since the gate electrode 150 according to this embodiment is structured such that the bottom face of the gate electrode 150 formed in steps, in contact with the Schottky layer 118, has a smaller area than that of the upper level thereof, capacitance Cch between the gate and the channel that is, the main component of the capacitance Cgs between the gate and the source, is rendered small. Also, since a length (gate length: Lg) of the gate electrode 150, on the bottom face thereof, in the direction of the source to the drain, is short, the mutual conductance gm is improved, thereby further enhancing the cut-off frequency fT.

As described in the foregoing, with the PHEMT 100 according to the first embodiment, the cap layer 120, composed of GaAs, is installed on top of the Schottky layer 118, composed of AlGas. As a result, the surface of chemically active AlGaAs is covered with chemically stable GaAs. Further, the gate electrode 150 is structured such that the lower part 152 of the stepped part thereof is embedded in a recess formed in such a fashion as to penetrate through the cap layer 120 and reach the Schottky layer 118, and the upper part of the stepped part thereof is formed to cover the cap layer 120. Accordingly, even after the gate electrode 150 is formed, exposure of chemically active AlGaAs (the Schottky layer 118) to the outer surface does not occur. As a result, highly reliable products can be provided. In addition, with the PHEMT 100 according to this embodiment, since the bottom face area of the gate electrode 150, facing the electrons in the Schottky layer 118, can be reduced, high mutual conductance gm can be secured, and the capacitance Cgs between the gate and the source can be lowered. As a result, a PHEMT having a high cut-off frequency fT can be fabricated.

[Second Embodiment]

Figure 3:
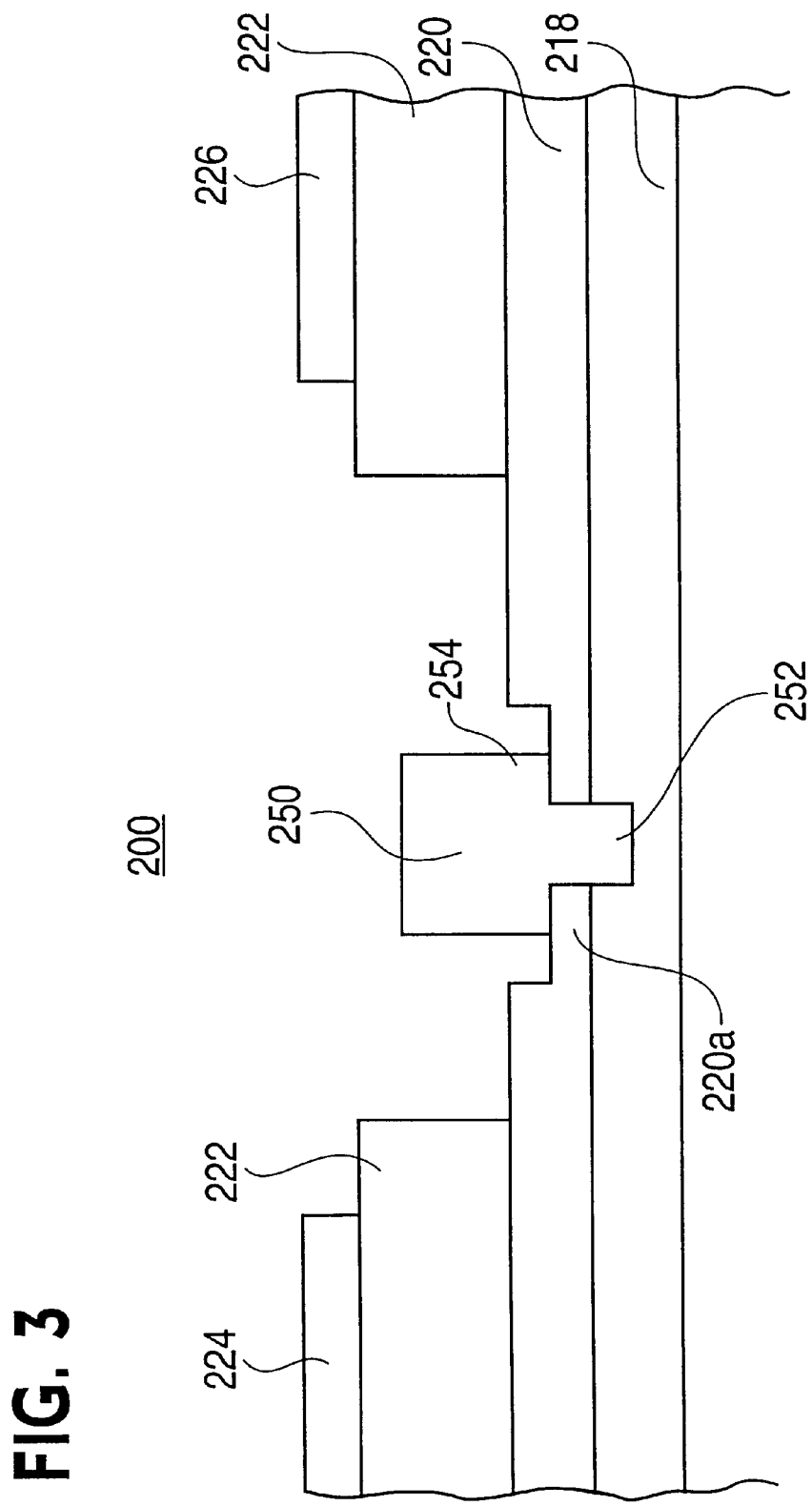
FIG. 3 is a schematic sectional view showing a structure of a PHEMT according to a second embodiment of the invention.

FIG. 3 is a schematic sectional view showing a structure of a PHEMT 200 according to a second embodiment of the invention. As shown in the figure, with the PHEMT 200, a Schottky layer 218, composed of Φ⁻AlGaAs, is formed to a thickness of about 500 angstroms, and a cap layer 220, composed of n-type GaAs at a donor density of about 3E 17 cm⁻³, is formed to a thickness of about 500 angstroms on the Schottky layer 218. This embodiment of the invention is characterized in that a region 220a (hereinafter referred to as a thinner layer region) of the cap layer 220, for forming a gate electrode, is etched substantially symmetrically against the gate electrode 250, and rendered thinner to a thickness of about 250 angstroms. Further, the gate electrode 250 is formed so as to be embedded in a recess formed in the thinner layer region 220a in such a fashion as to penetrate through the cap layer 220 and reach the Schottky layer 218. More particularly, as with the case of the first embodiment, the gate electrode 250 has a lower part thereof formed in steps, in a sectional view, and the bottom face 252 of the stepped part thereof intrudes into the Schottky layer 218, composed of Φ⁻AlGaAs, while the upper level 254 of the stepped part thereof is formed so as to overlie the cap layer 220, composed of n-type GaAs.

Then, n⁺layers 222, composed of n⁺GaAs, (refer to the figure) are formed on the cap layer 220, in regions where ohmic electrodes are formed. Further, on top of the n⁺layers 222, ohmic electrodes 224, 226 for serving as a source and a drain, respectively, are formed, respectively. As with the case of the first embodiment, the gate electrode 250 is set at offset towards the side of the source electrode 224 in an attempt to reduce a source resistance and improve a breakdown voltage between the gate and the drain. Further, the same structure as that for the first embodiment is fabricated underneath the Schottky layer 218 although not shown.

Next, the operation of the PHEMT 200 according to the second embodiment of the invention is described. Since the gate electrode 250 of the PHEMT 200 according to the second embodiment has the substantially same structure as that for the first embodiment, the operation thereof is substantially same as that for the first embodiment. In addition, with the PHEMT 200 according to the second embodiment, by forming the thinner layer region 220a in the cap layer 220, the cap layer 220, in regions where the source electrode 224 and the drain electrode 226 are formed thereon with the $n^+$ layers 222 interposed therebetween, can be formed to a thickness relatively thicker in comparison with the case of the first embodiment. Accordingly, with the second embodiment, a source resistance can be reduced from that for the first embodiment. In the example shown in FIG. 3, the cap layer 220 is rendered about twice as thick as for the first embodiment, thereby lowering a source resistance by about 30%. This will enable mutual conductance gm to be enhanced by 20%. On the other hand, capacitance Cgs between the gate and the source can be controlled to a slight increase on the order of about 5%. In the second embodiment, the cap layer 220 is rendered about twice as thick as that of the cap layer 120 according to the first embodiment, however, the cap layer 220 in the region 220a in close proximity of the gate is rendered thinner in thickness. Since the cap layer 220 according to the second embodiment, in the region 220a in close proximity of the gate, has a thickness substantially equivalent to that of the cap layer 120 according to the first embodiment, a drop in the breakdown voltage between the gate and the drain can be held down to several volts.

As described hereinbefore, the PHEMT 200 according to the second embodiment is capable of obtaining the same beneficial effect as that in the case of the PHEMT 100 according to the first embodiment. Furthermore, with the PHEMT 200 according to the second embodiment, the cap layer 220 is rendered thicker in thickness, but the region 220a thereof, in close proximity of the gate, is rendered thinner by means of etching so as to have the same thickness as that for the corresponding part of the first embodiment. Accordingly, with the second embodiment of the invention, the mutual conductance gm can be markedly enhanced while an increase of capacitance Cgs between the gate and the source can be held down to a minimum, so that a cut-off frequency fT can be further enhanced.

[Third Embodiment]

Figure 4:
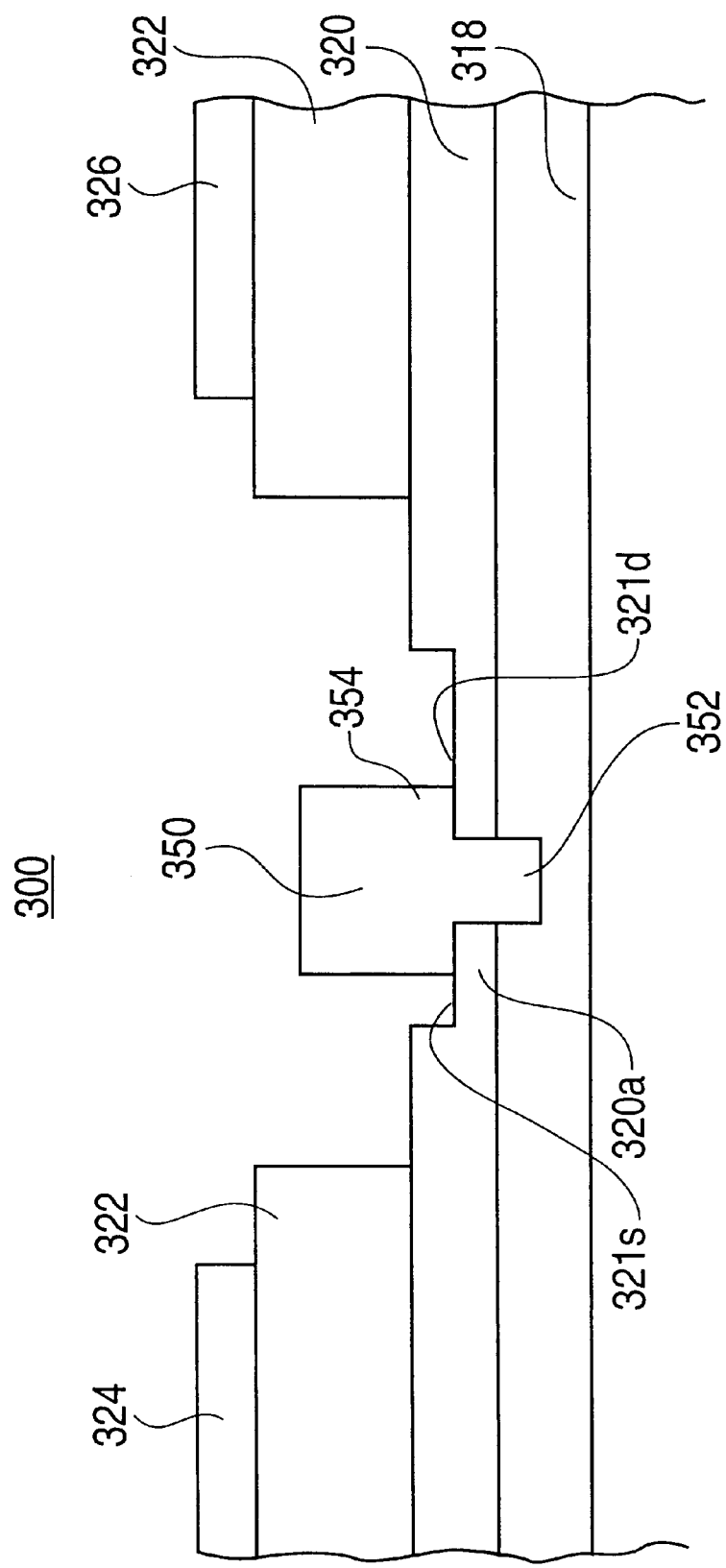
FIG. 4 is a schematic sectional view showing a structure of a PHEMT according to a third embodiment of the invention.

FIG. 4 is a schematic sectional view showing a structure of a PHEMT 300 according to a third embodiment of the invention. The PHEMT 300 according to the third embodiment has the substantially same structure as that for the PHEMT 200 according to the second embodiment. As shown in the figure, with the PHEMT 300, a Schottky layer 318, composed of $\Phi^-$AlGaAs, is formed to a thickness of about 500 angstroms, and a cap layer 320, composed of n-type GaAs at a donor density of about 3E 17 $cm^{-3}$, is formed to a thickness of about 500 angstroms on the Schottky layer 318. As with the case of the second embodiment, a region 320a of the cap layer 320, for forming a gate electrode (hereinafter referred to as a thinner layer region), is etched and rendered thinner to a thickness of about 250 angstroms. In the third embodiment, however, a length 321s of an etching region, on the side of the source, is the same as that of the second embodiment, however, a length 321d of the etching region, on the side of the drain, is rendered relatively longer. In the example shown in the figure, the thinner layer region occupies about half of a length of an exposed portion of the cap layer 320, between the gate and the drain. Similarly to the case of the second embodiment, a gate electrode 350 is formed so as to be embedded in a recess formed in the thinner layer region 320a in such a fashion as to penetrate through the cap layer 320 and reach the Schottky layer 318. More particularly, as with the case of the embodiment previously described, the gate electrode 350 has a lower part formed in steps in a sectional view, and an under structure 352 thereof intrudes into the Schottky layer 318, composed of $\Phi^-$AlGaAs while an upper structure 354 thereof is formed so as to overlie the cap layer 320, composed of n-type GaAs.

Then, $n^+$ layers 322, composed of $n^+$GaAs, are formed on the cap layer 320, in regions where ohmic electrodes are formed. Further, on top of the $n^+$layers 222, ohmic electrodes 324, 326 for serving as a source electrode and a drain electrode, respectively, are formed. As with the case of the first embodiment, and the second embodiment, the gate electrode 350 is set at offset towards the side of the source electrode 324 in an attempt to reduce a source resistance and enhance high breakdown voltage between the gate and the drain. Further, the same structure as that for the first embodiment is fabricated underneath the Schottky layer 318 although not shown.

With the PHEMT 300 according to the third embodiment, structured as described above, the structure between the gate electrode 350 and the source electrode 324 is substantially same as that for the second embodiment. Accordingly, with the third embodiment, a source resistance can be reduced by about 30%, and mutual conductance gm can be enhanced by about 20%.

Meanwhile, with the third embodiment, capacitance Cgs between the gate and the source can be held down to a slight increase of about 5%. Furthermore, in the third embodiment, as with the case of the second embodiment, the gap layer 320 is about twice as thick in comparison with the first embodiment, however, since the cap layer 320 is etched and rendered thinner to an extent of about half of a length between the gate and the drain, with respect to breakdown voltage between the gate and the drain, the substantially same value as that for the first embodiment can be obtained That is, with the PHEMT 300 according to the third embodiment, the same beneficial effect as that for the second embodiment can be obtained and in addition, a drop in breakdown voltage between the gate and the drain, occurring in the case of the second embodiment, can be held down to a minimum.

[Fourth Embodiment]

Figure 5:
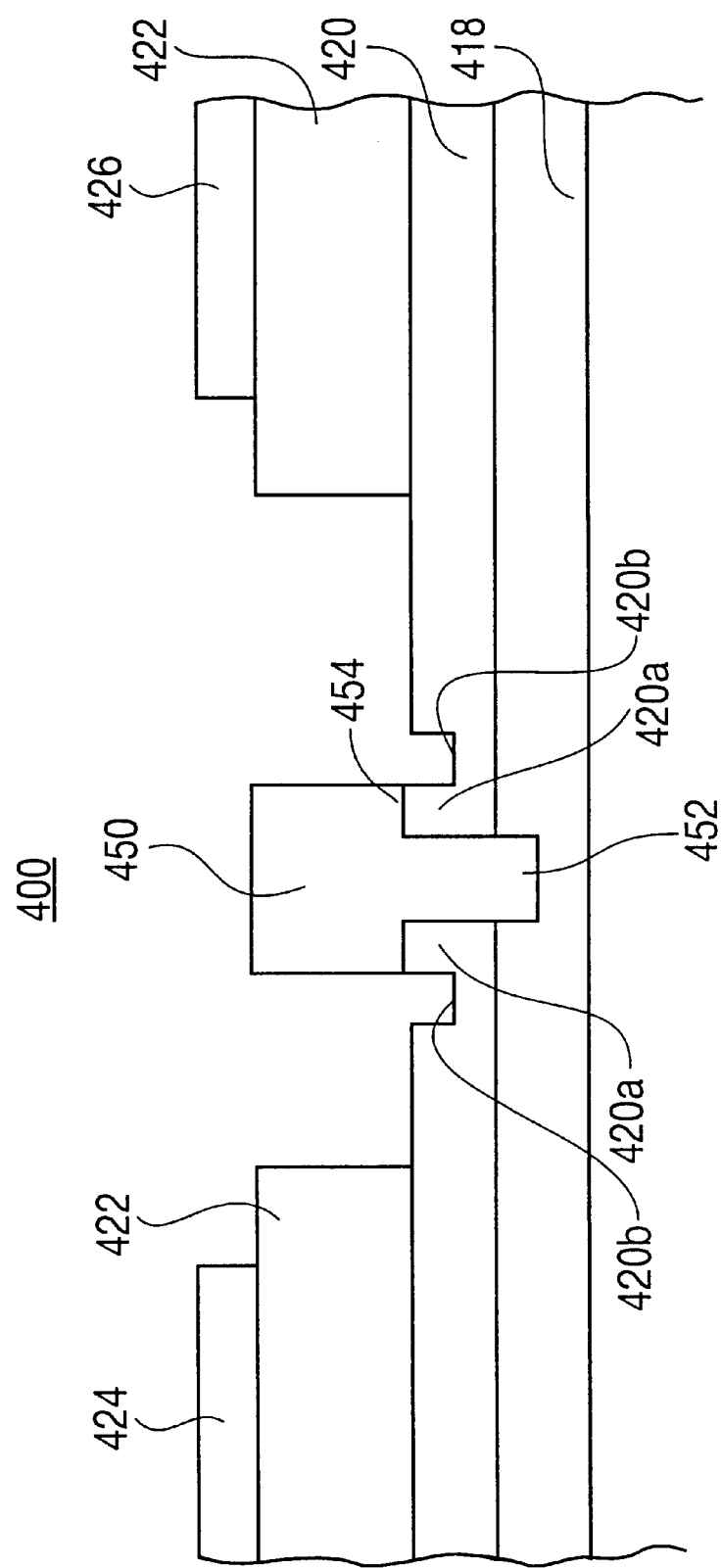
FIG. 5 is a schematic sectional view showing a structure of a PHEMT according to a fourth embodiment of the invention.

FIG. 5 is a schematic sectional view showing a structure of a PHEMT 400 according to a fourth embodiment of the invention. The PHEMT 400 according to the fourth embodiment has the substantially same structure as that for the embodiment previously described. That is, in this embodiment, a Schottky layer 418, composed of $\Phi^-$AlGaAs, is formed to a thickness of about 500 angstroms, and a cap layer 420, composed of n-type GaAs at a donor density of about 3E 17 $cm^{-3}$, is formed to a thickness of about 500 angstroms on the Schottky layer 418. Similarly to the case of the first embodiment, a gate electrode 450 is formed so as to be embedded in a recess formed in such a fashion as to penetrate through the cap layer 420 and reach the Schottky layer 418. More particularly, as with the case of the embodiment previously described, the gate electrode 450 has a lower part thereof formed in steps in a sectional view, and the bottom part 452 thereof intrudes into the Schottky layer 418, composed of Φ⁻AlGas, while an upper level 454 thereof is formed so as to overlie the cap layer 420, composed of n-type GaAs. In comparison with the first embodiment, however, the cap layer 420 is formed to a thickness about twice as thick. Accordingly, the gate electrode 450 is structured such that a difference in level of the stepped part thereof is about 750 angstroms, large enough to enable the bottom part thereof to reach the Schottky layer 418.

Further, this embodiment is characterized by a structure of the cap layer 420. More specifically, a thickness of about 500 angstroms is secured in regions 420*a* of the cap layer 420, for forming the gate electrode. On the other hand, regions 420*b* of the cap layer 420, surrounding the upper level 454 of the gate electrode 450, are etched symmetrically against the gate electrode 450 and rendered thinner to a thickness of about 250 angstroms.

In other respects, this embodiment is substantially same as the embodiment previously described. That is, n⁺layers 422, composed of n⁺GaAs, are formed on the cap layer 420, in regions where ohmic electrodes are formed, and further, on top of the n⁺layers 422, ohmic electrodes 424, 426 for serving as a source electrode and a drain electrode, respectively, are formed, respectively. As with the case of the first embodiment, and the second embodiment, the gate electrode 450 is set at offset towards the side of the source electrode 424 in an attempt to reduce a source resistance and enhance a breakdown voltage between the gate and the drain. Further, the same structure as that for the first embodiment is fabricated underneath the Schottky layer 418 although not shown.

The PHEMT 400 according to the fourth embodiment, structured as above, is the same as the PHEMT according to the second embodiment, except that the regions 420*a* of the cap layer 420, having a large thickness, exist underneath the upper level 454 of the gate electrode 450. Accordingly, with the fourth embodiment, source resistance can be reduced by about 30%, and mutual conductance gm can be enhanced by about 20% as with the case of the second embodiment. Further, with the fourth embodiment, the essentially same effect as that for the second embodiment can be obtained with respect to capacitance Cgs between the gate and the source as well because depletion regions can be formed in the regions 420*b* etched into the cap layer 420, surrounding the gate electrode 450. Further, with this embodiment, the essentially same effect as that for the second embodiment can be obtained with respect to breakdown voltage between the gate and the drain because the cap layer 420 is etched in the regions 420*b* around the gate electrode 450.

The PHEMT 400 according to the fourth embodiment is characterized in that after the formation of the gate electrode 450, the cap layer 420 can be etched in the regions 420*b* around the gate electrode. With the PHEMT 400 according to the fourth embodiment, having the structure as described above, not only the same beneficial effect as for the second embodiment can be obtained, but also it is possible to optimize the breakdown voltage between the gate and the drain, and mutual conductance gm by adjusting an amount of etching for the regions 420*b* of the cap layer 420, around the gate electrode 450, while checking up various characteristics of a FET, in particular, the breakdown voltage between the gate and the drain, and the mutual conductance gm. Therefore, some leeway may be available in designing a fabrication process. Needless to say, since the capacitance Cgs between the gate and the source can be held down to a minimum as with the case of the second embodiment, a high cut-off frequency fT can be ensured.

[Fifth Embodiment]

Figure 6:
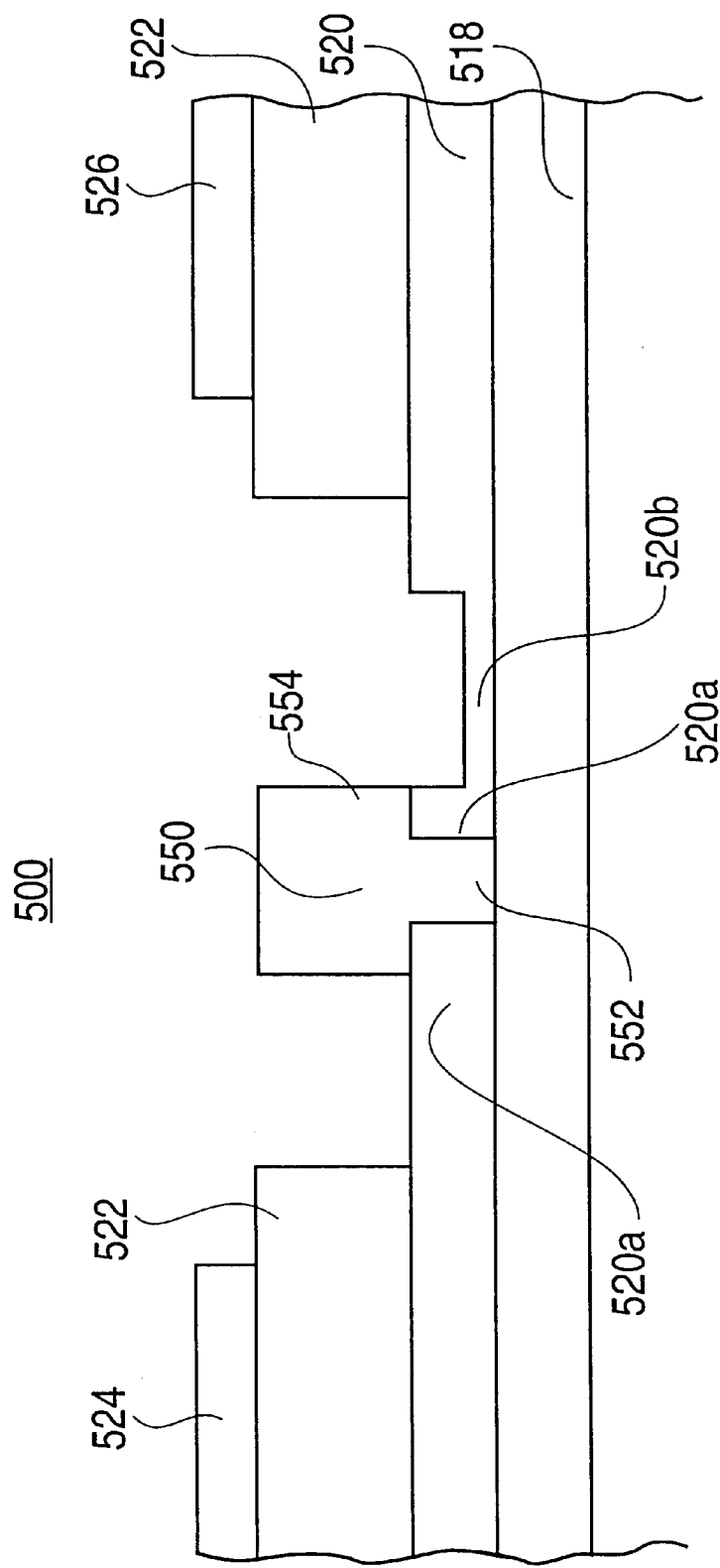
FIG. 6 is a schematic sectional view showing a structure of a PHEMT according to a fifth embodiment of the invention.

FIG. 6 is a schematic sectional view showing a structure of a PHEMT 500 according to a fifth embodiment of the invention. The PHEMT 500 according to the fifth embodiment has the substantially same structure as that for the fourth embodiment of the invention. That is, in this embodiment, a Schottky layer 518, composed of Φ⁻AlGaAs, is formed to a thickness of about 500 angstroms, and a cap layer 520, composed of n-type GaAs at a donor density of about 3E 17 cm⁻³, is formed to a thickness of about 500 angstroms on the Schottky layer 518. Similarly to the case of the fourth embodiment, a gate electrode 550 is formed so as to be embedded in a recess formed in such a fashion as to penetrate through the cap layer 520 and reach the Schottky layer 518. More particularly, as with the case of the embodiment previously described, the gate electrode 550 has a lower part thereof formed in steps in a sectional view, and the bottom part 552 thereof intrudes into the Schottky layer 518, composed of Φ⁻AlGaAs, while an upper level 554 thereof is formed so as to overlie the cap layer 520, composed of n-type GaAs. In comparison with the first embodiment, however, the cap layer 520 is formed to a thickness about twice as thick. Accordingly, the gate electrode 550 is structured such that a difference in level of the stepped part thereof is about 750 angstroms, large enough to enable the bottom thereof to reach the Schottky layer 518.

Further, this embodiment is characterized by a structure of the cap layer 520. More specifically, the cap layer 520 has regions 520*a* for forming the gate electrode, wherein a thickness of about 500 angstroms is secured. Further, the cap layer 520 is etched, and rendered thinner to a thickness of about 250 angstroms in a region 520*b*, formed on the drain side of the upper level 554 of the gate electrode 550.

In other respects, this embodiment is substantially same as the embodiment previously described That is, n⁺layers 522, composed of n⁺GaAs, are formed on the cap layer 520, in regions where ohmic electrodes are formed, and further, on top of the n⁺layers 522, ohmic electrodes 524, 526 for serving as a source electrode and a drain electrode, respectively, are formed. As with the case of the embodiment previously described, the gate electrode 550 is set at offset towards the side of the source electrode 524 in an attempt to reduce a source resistance and enhance a breakdown voltage between the gate and the drain. Further, the same structure as that for the fist embodiment is fabricated underneath the Schottky layer 518 although not shown.

With the PHEMT 500 according to the fifth embodiment, structured as above, wherein the cap layer 520 (520*a*) has a thick thickness over the entire length between the gate and the source, it is possible to reduce source resistance by about 35% in comparison with the case of the first embodiment. Accordingly, mutual conductance gm can be enhanced by about 25%. As a result, capacitance Cgs between the gate and the source is increased by about 10%. Further, since the cap layer 520 is etched in the region 520*b*, adjacent to the gate electrode 550, on the side of the drain 526, breakdown voltage between the gate and the drain is not different from that for the first and third embodiments, respectively.

Similarly to the case of the fourth embodiment, with the PHEMT 500 according to the fifth embodiment, it is possible to etch the cap layer 520 in the region 520*b* between the gate and the drain after the formation of the gate electrode 550. This makes it possible to optimize a breakdown voltage between the gate and the drain, and mutual conductance gm by adjusting an amount of etching for the cap layer in the region 520b while checking up the breakdown voltage between the gate and the drain, and the mutual conductance gm of the FET. Therefore, a leeway may be available in designing a fabrication process.

Further, this embodiment is advantageous particularly when the PHEMT 500 has a threshold voltage on the side more positive, for example, in the case of the PHEMT 500 being in the enhancement mode of operation at +0.1V. That is, in such a case, two-dimensional electron gas in the cap layer is known to be on the decrease due to the effect of surface depletion. In this embodiment wherein one of the regions 520a of the cap layer, on the side of the source 524, is formed to a thick thickness over a length up to the side face of the gate electrode 550, a depletion layer is hard to develop, thereby providing the PHEMT 500 with characteristic for high mutual conductance gm.

Thus, with the PHEMT 500 according to the fifth embodiment, wherein the region 520a of the cap layer is formed over the whole length between the gate and the source, and the region 520b is formed on the drain side of the gate electrode 550 by etching the cap layer to a thin thickness after the formation of the gate electrode 550, both the mutual conductance gm and the breakdown voltage between the gate and the drain can be largely adjusted in spite of a slight increase in the capacitance Cgs between the gate and the source, in addition to the PHEMT 500 having the same beneficial effect as that for the PHEMT 300 according to the third embodiment.

Accordingly, the fifth embodiment of the invention can provide a semiconductor device having desired characteristics.

[Sixth Embodiment]

Figure 7:
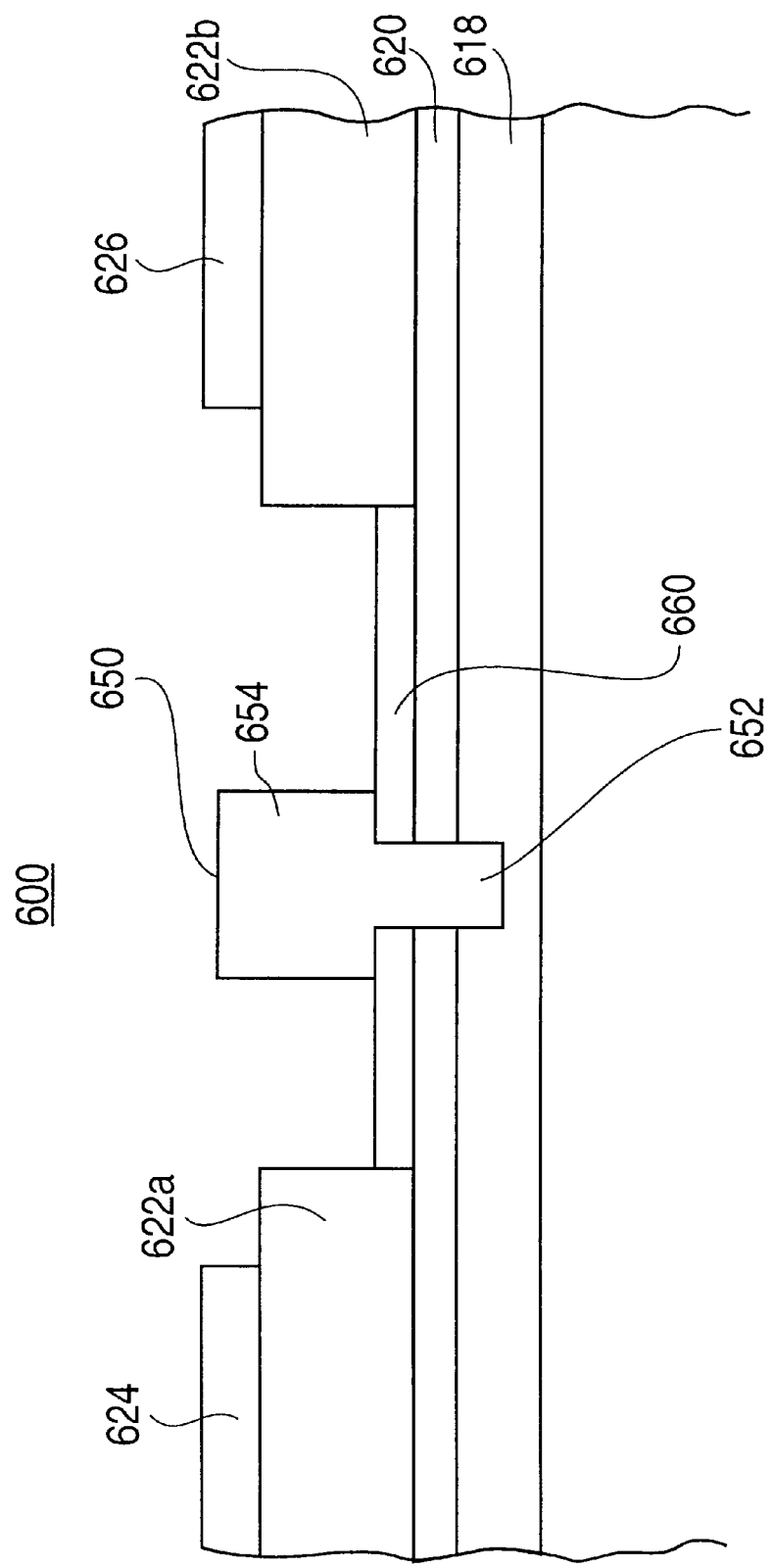
FIG. 7 is a schematic sectional view showing a structure of a PHEMT according to a sixth embodiment of the invention.

FIG. 7 is a schematic sectional view showing a structure of a PHEMT 600 according to a sixth embodiment of the invention. As with the case of the embodiment previously described, in the PHEMT 600, a cap layer 620, composed of n-type GaAs at a donor density of about 3E 17 $cm^{-3}$, is formed to a thickness of about 250 angstroms on a Schottky layer 618, composed of $\Phi^-$AlGaAs, and formed to a thickness of about 500 angstroms. Further, $n^+$layers 622, composed of $n^+$GaAs at a donor density of about 4E 18 $cm^{-3}$, are formed to a thickness of 1000 angstroms on the cap layer 620, in regions where ohmic electrodes are formed, and further, on top of the $n^+$layers 622a, 622b, ohmic electrodes 624, 626 for serving as a source electrode and a drain electrode, respectively, are formed, respectively.

Now this embodiment is characterized in that a spacer insulation film layer 660 made of an insulating film composed of SiN or the like is formed to a thickness of about 250 angstroms on the cap layer 620, in a region exposed between the $n^+$layers 622a, and 622b, for forming the source electrode and the drain electrode, respectively. A gate electrode 650 is formed so as to be embedded in a recess formed in such a fashion as to penetrate through the spacer insulation film layer 660 and the cap layer 620 and reach the Schottky layer 618. More particularly, as with the case of the embodiment previously described, the gate electrode 650 has a lower part thereof formed in steps in a sectional view, and a bottom level 652 thereof intrudes into the Schottky layer 618, composed of $\Phi^-$AlGaAs. An upper level 654 thereof is formed so as to overlie the spacer insulation film layer 660 made up of an insulating film composed of SiN or the like. Accordingly, the gate electrode 650 is structured such that a difference in level of the stepped part thereof is about 750 angstroms, large enough to enable the bottom level 652 thereof to reach the Schottky layer 618. Further, the same structure as that for the first embodiment is fabricated underneath the Schottky layer 618 although not shown.

The PHEMT 600 according to the sixth embodiment has the same construction as that for the first embodiment of the invention except that the spacer insulation film layer 660 is formed on top of the cap layer 620, and the upper level 654 of the gate electrode 650 overlies the spacer insulation film layer 660. Accordingly, the PHEMT 600 according to this embodiment is able to attain the same beneficial effect as that for the first embodiment. In addition, in this embodiment with the upper level 654 of the gate electrode 650 overlying the spacer insulation film layer 660, it is possible to secure the same value as that for the first embodiment in respect of mutual conductance gm and the breakdown voltage between the gate and the drain while reducing capacitance Cgs between the gate and the source by about 5%.

[Seventh Embodiment]

Figure 8:
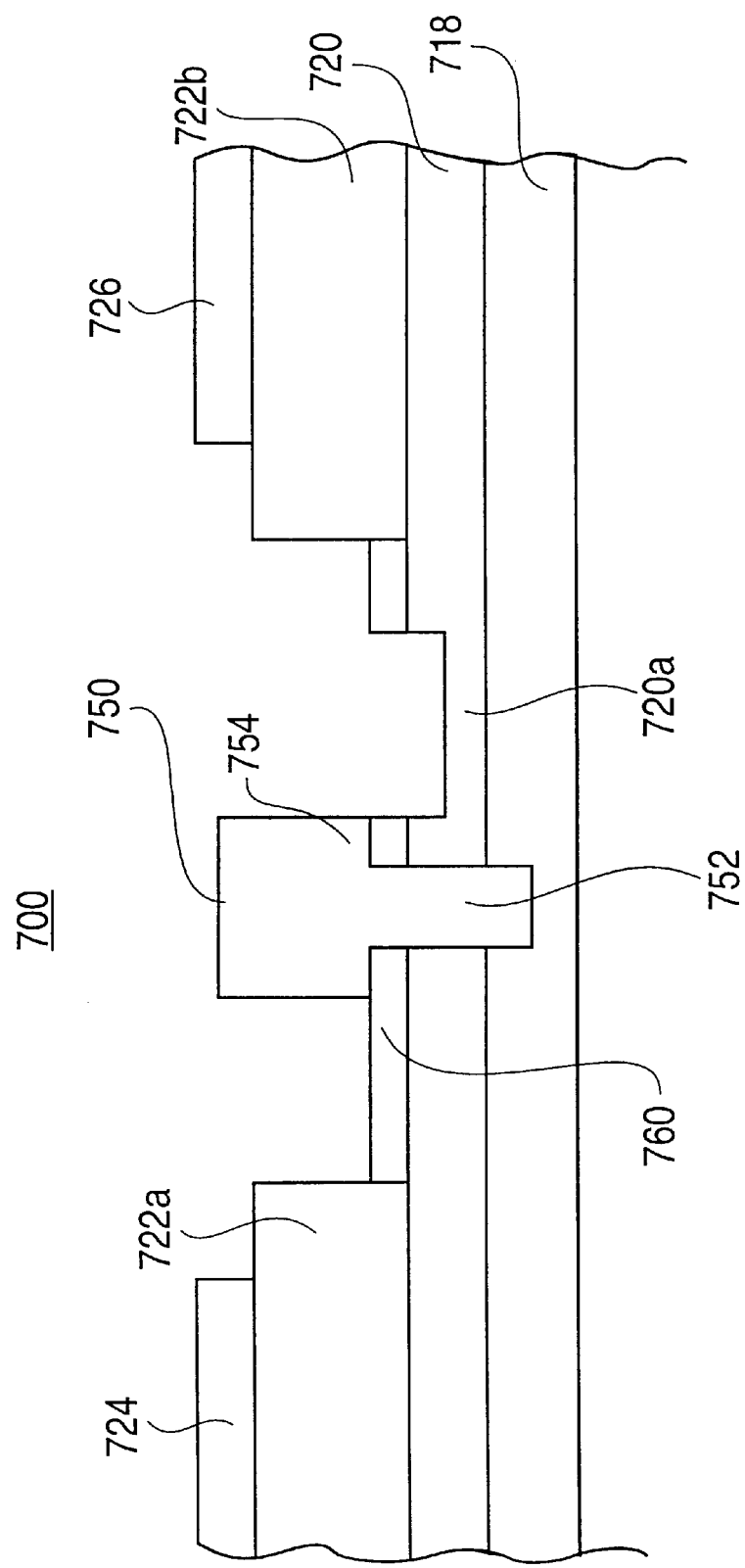
FIG. 8 is a schematic sectional view showing a structure of a PHEMT according to a seventh embodiment of the invention.

FIG. 8 is a schematic sectional view showing a structure of a PHEMT 700 according to a seventh embodiment of the invention. The PHEMT 700 has a construction similar to that of the sixth embodiment in a sectional view. More particularly, as with the case of the embodiment previously described, a cap layer 720, composed of n-type GaAs at a donor density of about 3E 17 $cm^{-3}$, is formed to a thickness of about 500 angstroms on a Schottky layer 718, composed of $\Phi^-$AlGaAs, and formed to a thickness of about 500 angstroms. Further, $n^+$layers 722, composed of $n^+$GaAs at a donor density of about 4E 18 $cm^{-3}$, are formed to a thickness of 1000 angstroms on the cap layer 720, in regions where ohmic electrodes are formed, and further, on top of the $n^+$ layers 722a, 722b, ohmic electrodes 724, 726 for serving as a source electrode and a drain electrode, respectively, are formed, respectively.

Further, as with the case of the sixth embodiment, a spacer insulation film layer 760 made of an insulating film composed of SiN or the like is formed to a thickness of about 250 angstroms on the cap layer 720, in a region exposed between the $n^+$layers 722a, and 722b, for forming the source electrode and the drain electrode, respectively. A gate electrode 750 is formed so as to be embedded in a recess formed in such a fashion as to penetrate through the spacer insulation film layer 760 and the cap layer 720 and reach the Schottky layer 718. More particularly, as with the case of the embodiment previously described, the gate electrode 750 has a lower part thereof formed in steps in a sectional view, and a bottom level 752 thereof intrudes into the Schottky layer 718, composed of $\Phi^-$AlGaAs. An upper level 754 thereof is formed so as to overlie the spacer insulation film layer 760 made up of an insulating film composed of SiN or the like. Accordingly, the gate electrode 750 is structured such that a difference in level of the stepped part thereof is about 1000 angstroms, large enough to enable the bottom level 752 thereof to reach the Schottky layer 718. Further, the same structure as that for the first embodiment is fabricated underneath the Schottky layer 718 although not shown.

The seventh embodiment of the invention is characterized in that, in contrast to the sixth embodiment, the cap layer 720 and the spacer insulation film layer 760 are etched in a region 720a by the gate electrode 750, on the side of the drain electrode 726. As a result, the cap layer 720 on the side of the drain electrode 726 is rendered thinner to a thickness of about 250 angstroms.

The PHEMT 700 according to the seventh embodiment, constructed as above, has the essentially same construction as that for the fifth embodiment except that the spacer insulation film layer 760 is formed on top of the cap layer 720, and the upper level 754 of the gate electrode 750 overlies the spacer insulation film layer 760. Accordingly, the PHEMT 700 according to this embodiment is able to attain the same beneficial effect as that for the fifth embodiment. That is, since the upper level 754 of the gate electrode 750 overlies the spacer insulation film layer 760, capacitance Cgs between the gate and the source can be reduced by about 5%. Also, it is possible to maintain the same value as that for the fifth embodiment in respect of mutual conductance gm and breakdown voltage between the gate and the drain. Thus, with this embodiment, a cut-off frequency fT can be enhanced because the capacitance Cgs between the gate and the source can be reduced without altering the mutual conductance gm.

[Eighth Embodiment]

FIGS. 9 through 16 are cross-sectional representations of various steps in a process of fabricating a semiconductor device, according to an eighth embodiment of the invention. The eighth embodiment relates to the process of fabricating a semiconductor device having the substantially same construction as that of the PHEMT 100 according to the first embodiment of the invention.

Figure 9:
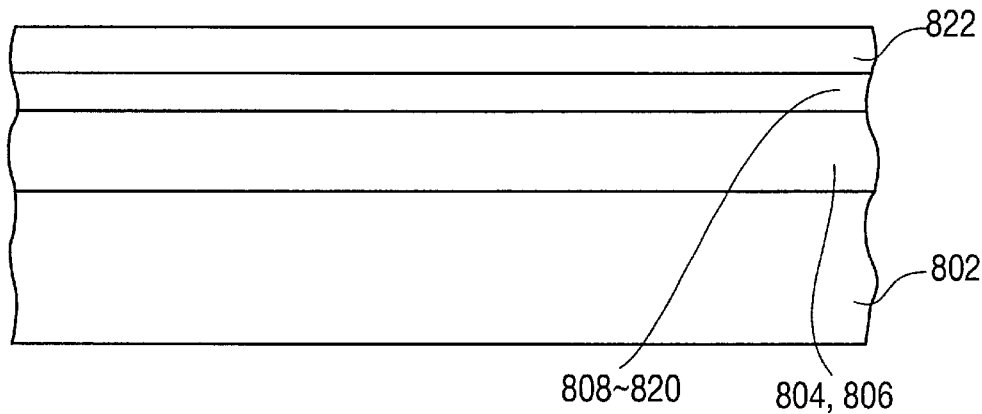
FIG. 9 is a schematic illustration in section of a step of a process of fabricating a semiconductor device, according to an eighth embodiment of the invention.

As shown in FIG. 9, an epiwafer 800 with all the compound semiconductor layers corresponding to those of the PHEMT 100 according to the first embodiment, formed thereon through epitaxial growth, is first fabricated on a semi-insulating GaAs substrate 802 by means of the molecular beam epitaxy (MBE). More specifically, as shown in the figure by way of example, the epiwafer 800 comprises the semi-insulating GaAs substrate 802, on top of which a first buffer layer 804, composed of $\Phi^-$GaAs, a second buffer layer 806, composed of $\Phi^-$AlGaAs, a first electron supply layer 808, composed of $n^+$AlGaAs, a first spacer 810, composed of $\Phi^-$AlGaAs, a channel layer 812, composed of $\Phi^-$InGaAs, a second spacer 814, composed of $\Phi^-$AlGaAs, and a second electron supply layer 816, composed of $n^+$AlGaAs, a Schottky layer 818, composed of $\Phi^-$AlGaAs, and a cap layer 820, composed of GaAs, are deposited in that order. Further, on top of the cap layer 820, a $n^+$GaAs layer 822 is deposited, making up the uppermost layer.

Figure 10:
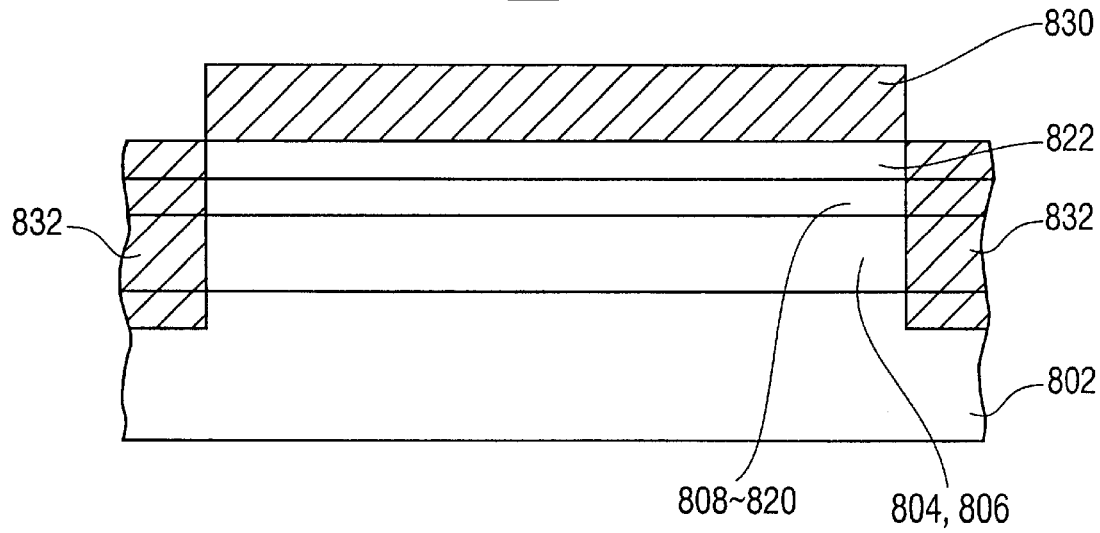
FIG. 10 is a schematic illustration in section of a step of the process of fabricating the semiconductor device, according to the eighth embodiment of the invention.

Next, as shown in FIG. 10, a patterned photoresist 830 with necessary photoresist left intact is formed on parts of the surface of the epiwafer 800a, for serving as an electron transit region, by use of the lithographic techniques. Oxygen ions are implanted deep into regions (insulation regions) 832, not covered by the photoresist, through the first buffer layer 804 and secondbuffer layer 806. The insulation regions 832 are thus formed, effecting separation between devices.

Figure 11:
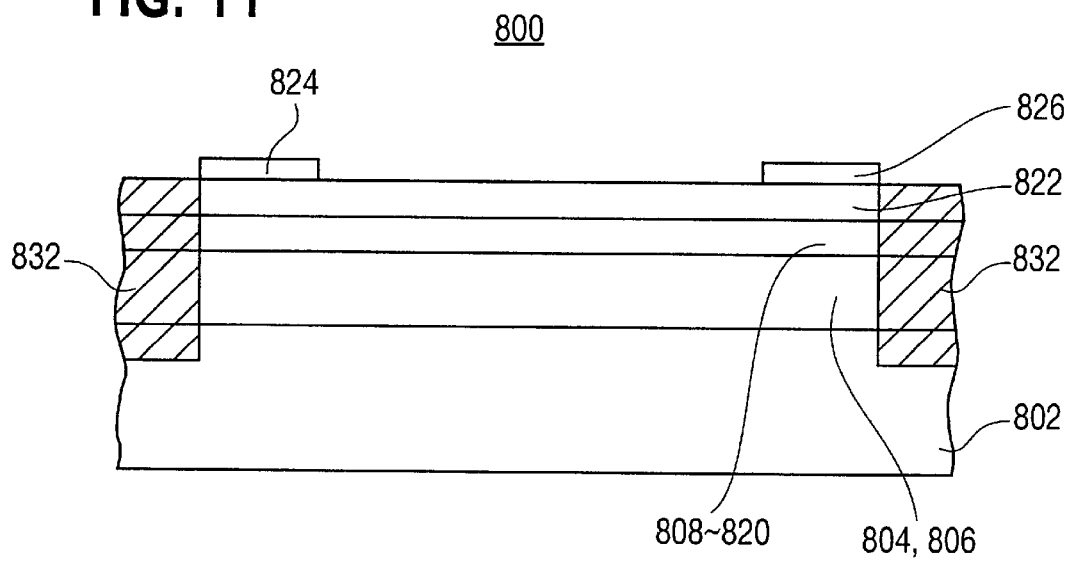
FIG. 11 is a schematic illustration in section of a step of the process of fabricating the semiconductor device, according to the eighth embodiment of the invention.

Then, as shown in FIG. 11, after removal of the patterned photoresist 830, ohmic electrodes 824, 826, composed of AuGe, are formed by means of the vacuum evaporation/lift-off method.

Figure 12:
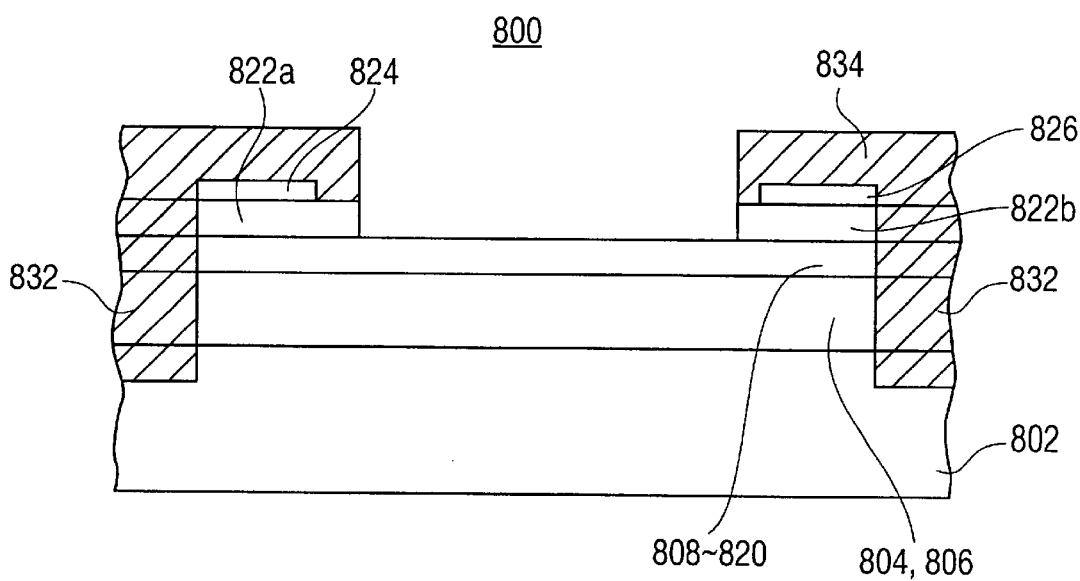
FIG. 12 is a schematic illustration in section of a step of the process of fabricating the semiconductor device, according to the eighth embodiment of the invention.

Subsequently, as shown in FIG. 12, a patterned photoresist 834 is formed such that an opening is formed in a region between the ohmic electrodes 824, and 826 by means of the lithographic techniques. Using the patterned photoresist 834 as a mask, the $n^+$GaAs layer 822 is removed by means of the reactive ion etching (RIE) method using a mixed gas containing $^{12}$carbon. In regions for forming a source electrode and a drain electrode, $n^+$ regions 822a, 822b are formed, respectively.

Figure 13:
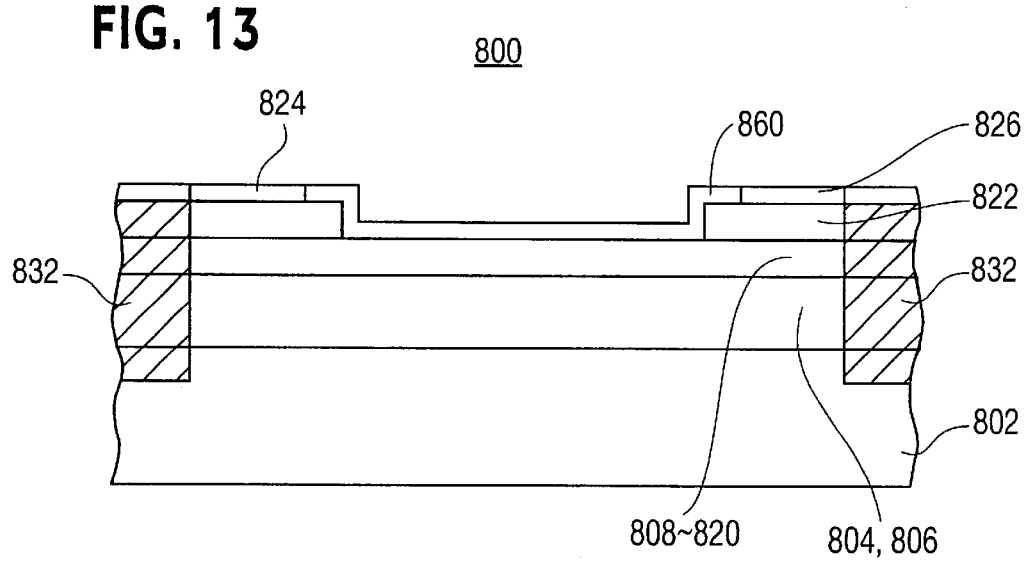
FIG. 13 is a schematic illustration in section of a step of the process of fabricating the semiconductor device, according to the eighth embodiment of the invention.

Then, after removal of the patterned photoresist 834, a SiN film as a spacer insulation film layer 860 is deposited across the surface of the wafer. Thereafter, a patterned photoresist (not shown) provided with openings only above the ohmic electrodes 824, 826 is formed by use of the photolithographic techniques, and by removing the SiN film in unnecessary parts, a structure in the shape shown in FIG. 13 is obtained.

Figure 14:
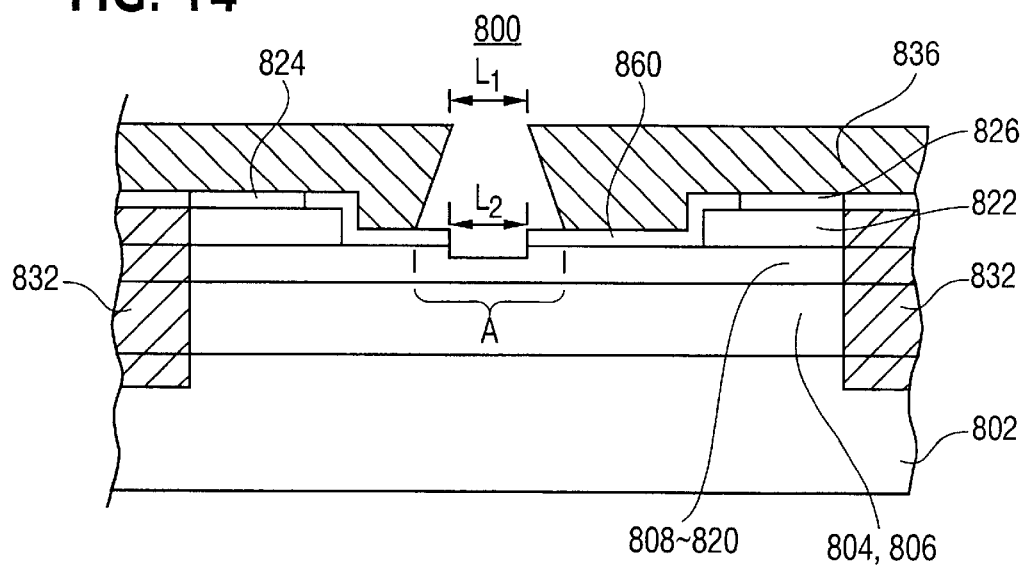
FIG. 14 is a schematic illustration in section of a step of the process of fabricating the semiconductor device, according to the eighth embodiment of the invention.

Subsequently, a photoresist 836 patterned in an overhanging shape in section as shown FIG. 14 is formed in a region where the spacer insulation film layer 860 is exposed through i-line exposure with a stepper using an i-line photoresist FSMR (manufactured by Fuji Chemicals Industrial Co., Ltd.). Thereafter, the spacer insulation film layer 860 is etched over a length L2, about 0.55 $\mu$m long, substantially equivalent to a length L1, about 0.5 $\mu$m long, of an opening provided in the photoresist, with the use of the reactive ion etching (RIE) system (with the wafer placed on the cathode) using $SF_6$ gas. At this point in time, it is desirable to adust gas pressure in the reaction chamber of the system at about 1 Pa (Pascal) in order to enhance anisotropic etching by controlling section of F ions in plasma in the vertical direction.

Subsequently, by changing over to a gas containing $^{12}$carbon, the cap layer ($n^-$GaAs) 820 is completely removed. Then, a part of the Schottky layer ($\Phi^-$AlGaAs) 818 is removed. Thereafter, with the use of the reactive ion etching (RIE) system (with the wafer placed on the anode) using $SF_6$ gas again, edge parts remaining on an opening of the spacer insulation film layer 860 are removed, so that the edge thereof is set back up to regions indicated by a length L3 in FIG. 15. At this point in time, it is desirable to adjust gas pressure in the reaction chamber at about 20 Pa in order to control movement of F ions in plasma in an isotropic direction. In a common RIE system, plasma etching described above may be performed by changing over wiring of a RF power source to parallel plate type electrodes, above and below, in reverse. In this way, a series of process steps can be applied without taking the wafer out of the reaction chamber, thus achieving processing with a high repeatability. Thus, an opening 860a of the spacer insulation film layer 860, having a length L3, about 1 $\mu$m, is formed.

Subsequently, a material for the gate electrode 850 is formed into the gate electrode 850 as shown in FIG. 16 by means of the vacuum evaporation/lift-off method, whereupon a PMEMT 800 is completed. At this point in time, the gate electrode 850 will have a length L4, about 0.8 $\mu$m, between opposite edges 854 thereof, at an upper level, due to spreading of an injection angle of an evaporated substance through vacuum evaporation. Since the length L2 of the bottom part 852 of the gate electrode 850 is about 0.55 $\mu$m, the opposite edges 854 of the gate electrode 850, at the upper level, can have a length L5 on the order of 0.125 $\mu$m on either side thereof, sufficient for overlying the cap layer 820 of n-GaAs.

As described in the foregoing, with this embodiment, using the photoresist 836 patterned in an opening for forming the electrode 850 as a mask, the opening 860a, equivalent in size to the opening in the photoresist, is first formed in the spacer insulation film layer 860 by use of anisotropic etching. Subsequently, using again the photoresist 836 patterned in the opening as a mask, the cap layer 820 of n-GaAs is removed, and then, a portion of the Schottky layer 818 thereunder is removed. Thereafter, by changing etching condition over to isotropic etching, the edge parts of the spacer insulation film layer 860 are removed. Further, by use of the photoresist 836 patterned in the opening again, the gate electrode 850 is formed by means of the vacuum evaporation/lift-off method. Thus, with this embodiment, since continuous processing can be executed without taking the wafer into the atmosphere out of the reaction chamber of the RIE system, there is no risk of reaction products deposited on the wafer coming in contact with moisture, and so forth in the atmosphere, generating by-products interfering with the etching process. Accordingly, underlayer processing with good repeatability can be carried out, and the PHEMT 800 can be fabricated wherein the chemically unstable Schottky layer (Φ–AlGaAs) 818 is not allowed to be exposed at all because the opposite edges 854 of the gate electrode 850, at the upper level thereof, overlie throughout the surface of the cap layer (n-GaAs) 820.

[Ninth Embodiment]

Figure 19:
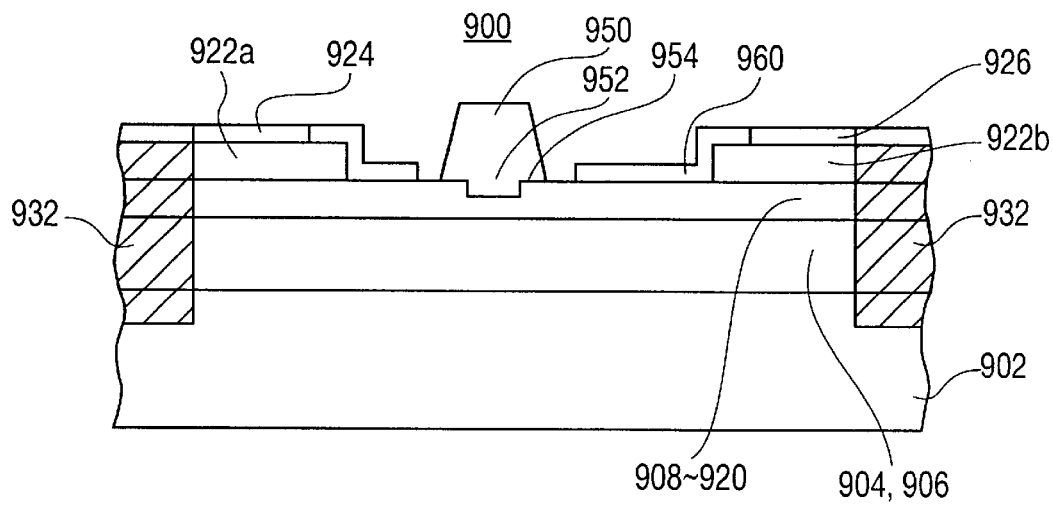
FIG. 19 is a schematic illustration in section of a step of the process of fabricating the semiconductor device, according to the ninth embodiment of the invention.

Similarly to the case of the eighth embodiment, FIGS. 17 through 19 are cross-sectional representations of various steps in a process of fabricating a PHEMT 900 according to a ninth embodiment, having the substantially same construction as that of the PHEMT 100 according to the first embodiment of the invention. In explanation on the process, described hereinafter, parts formed by the essentially same steps of the process as those for the first embodiment will be denoted by the same reference numerals at the lower two places, thereby avoiding duplicated explanation.

Substantially in the same way as in the process according to the eighth embodiment, with the process of fabricating the PHEMT 900 according to the ninth embodiment, after the structure shown in FIG. 13 is fabricated, a first patterned photoresist 936a for an opening with a length L1, about 0.3 μm long, as shown in FIG. 17, is formed by use of an i-line positive photoresist (THMR as trade name, manufactured by Tokyo Ohka Kogyo Co., Ltd), having high resolution. Then, as with the case of the eighth embodiment, using the first patterned photoresist 936a as a mask, a spacer insulation film layer 960 is etched, and at the same time, a part of a cap layer 920 is removed. Further, a portion of a Schottky layer 918 is etched. In the case of this embodiment, an opening of the cap layer 920 as well as the Schottky layer 918 has a length L2, about 0.35 μm long.

Subsequently, after the first patterned photoresist 936a is completely removed, and the wafer is cleaned, a second patterned photoresist 936b having an opening with a length L6, 0.4 μm long, is formed by use of an i-line negative photoresist (FSMR) as shown FIG. 18. After edge parts remaining on an opening of a spacer insulation film layer 960 are removed in the same way as in the case of the eighth embodiment, the vacuum evaporation/lift-off method is applied to a material for the gate electrode 950, whereupon a PMEMT 900 shown in FIG. 19 is completed. In FIG. 18, only the shape of the gate electrode 950 after the application of the vacuum evaporation method is shown to indicate relationship in size among various parts. Further, in FIG. 18, metals deposited under the second patterned photoresist 936b are not shown to avoid complication in the figure.

As shown in the figure, the PHEMT 900 according to this embodiment can be structured such that opposite edges 954 of the gate electrode 950, at an upper level thereof, has a dimension L4 therebetween, about 0.7 μm, so as to overlie the cap layer 920 over a length L5, on the order of 0.175 μm, on either side thereof. Accordingly, a case of misalignment between the fist patterned photoresist 936a and the second patterned photoresist 936b to an extent of ±0.07 μm, at maximum, can be sufficiently coped with.

As described in the foregoing, with this embodiment, two types of the patterned photoresists 936 (936a, 936b) are used for forming the gate electrode 950. First, after the formation of a first patterned photoresist 936a by use of a high resolution positive photoresist, the cap layer 920 and the Schottky layer 918, are etched to optional micro-sizes. Thereafter, the first patterned photoresist 936a is removed, whereupon a second patterned photoresist 936b is formed by use of a negative photoresist for patterning an overhanging shape in section. By use of the second patterned photoresist as a mask, the vacuum evaporation/lift-off method is applied to a material for the gate electrode 950. It is possible therefore to render the bottom part 952 of the gate electrode 950, determining most of the electric characteristics of a semiconductor device, to a minuscule size with more ease. Further, even if there occurs misalignment of masks between the first patterned photoresist 936a and the second patterned photoresist 936b at the time of exposure, the Schottky layer 918 (Φ⁻AlGaAs), chemically unstable, is not allowed to be exposed at all because of the structure of the device wherein the upper level 954 of the gate electrode 950 overlies filly the surface of the cap layer (n⁻GaAs) 920. Accordingly, the PHEMT 900, highly stable and highly reliable, can be fabricated.

[Tenth Embodiment]

Next, a tenth embodiment of the invention described hereinafter relates to a number of processes of fabricating the PHEMT 200 according to the second embodiment, shown in FIG. 3. In the case of this embodiment as well, parts formed by the essentially same steps of the process as those for the embodiment previously described will be denoted by the same reference numerals at the lower two places, thereby avoiding duplicated explanation.

According to a first process, in one of the steps in the process of fabricating the semiconductor device, according to the eighth embodiment, as shown in FIG. 9, the cap layer (n⁻GaAs) 820 of the epiwafer 800 is set to have a thickness about twice as thick, and the same steps of processing as those shown in FIGS. 9 to 15 are applied Subsequently, only the cap layer (n⁻GaAs) 820 exposed in the opening 860a the spacer insulation film layer 860 is etched By applying the vacuum evaporation/lift-off method to a gate electrode material after etching with the use of an etchant having chemical selectivity not to etch the Schottky layer (Φ⁻AlGaAs) 818, the structure of the PHEMT 200 according to the second embodiment, shown in FIG. 3, can be formed.

Otherwise, according to a second process, after applying various steps in the process of fabricating the semiconductor device, according to the eighth embodiment, described with reference to FIGS. 9 to 13, etching of the cap layer 820 as illustrated in FIG. 14 is adjusted to a slightly smaller amount. Subsequently, the structure as illustrated in FIG. 15 is formed, and by applying the vacuum evaporation/lift-off method to a gate electrode material after etching with the use of an etchant for etching both the cap layer (n⁻GaAs) 820 and the Schottky layer (Φ⁻AlGaAs) 818, exposed in the opening 860a of the spacer insulation film layer 860, having no chemical selectivity, the structure of the PHEMT 200 according to the second embodiment, shown in FIG. 3, can be formed.

Alternatively, according to a third process, after applying one of the steps in the process of fabricating the semiconductor device, according to the ninth embodiment, shown in FIG. 17, the second patterned photoresist 936b is formed as shown in FIG. 18. After etching of the edge parts of the spacer insulation film layer 960 is completed, etching treatment is applied with the use of either an etchant having chemical selectivity or an etchant having no chemical selectivity. Thereafter, by applying the vacuum evaporation/lift-off method to a gate electrode material, the structure of the PHEMT 200 according to the second embodiment, shown in FIG. 3, can be formed.

As described above, with this embodiment, the cap layer (n⁻GaAs) 820 (920) of the epiwafer is set to have a thickness about twice as thick in comparison with that for the PHEMT 100 according to the first embodiment. Further, the photoresist 836 (936) patterned in an overhanging shape in a sectional view is formed for applying the vacuum evaporation/lift-off method to a gate electrode material After etching the edge parts of the spacer insulation film layer 860 (960), the cap layer (n⁻GaAs) 820 (920) is further etched to about half of the thickness thereof, and subsequently, by applying the vacuum evaporation/lift-off method to a gate electrode material, the structure of the PHEMT 200 according to the second embodiment, shown in FIG. 3, can be fabricated.

[Eleventh Embodiment]

Figure 20:
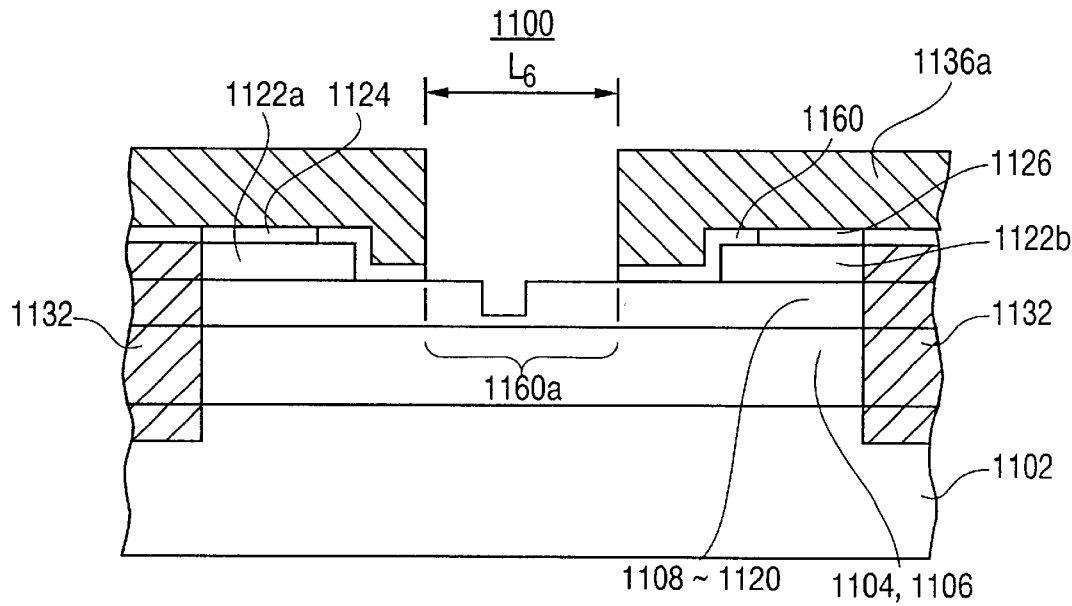
FIG. 20 is a schematic illustration in section of a step of a process of fabricating a semiconductor device, according to an eleventh embodiment of the invention.
Figure 21:
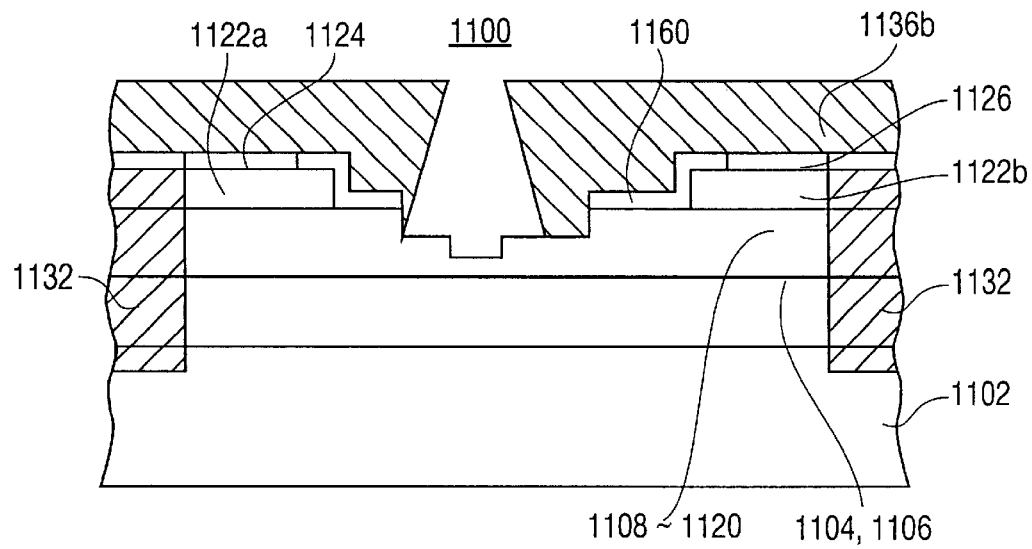
FIG. 21 is a schematic illustration in section of a step of the process of fabricating the semiconductor device, according to the eleventh embodiment of the invention.
Figure 22:
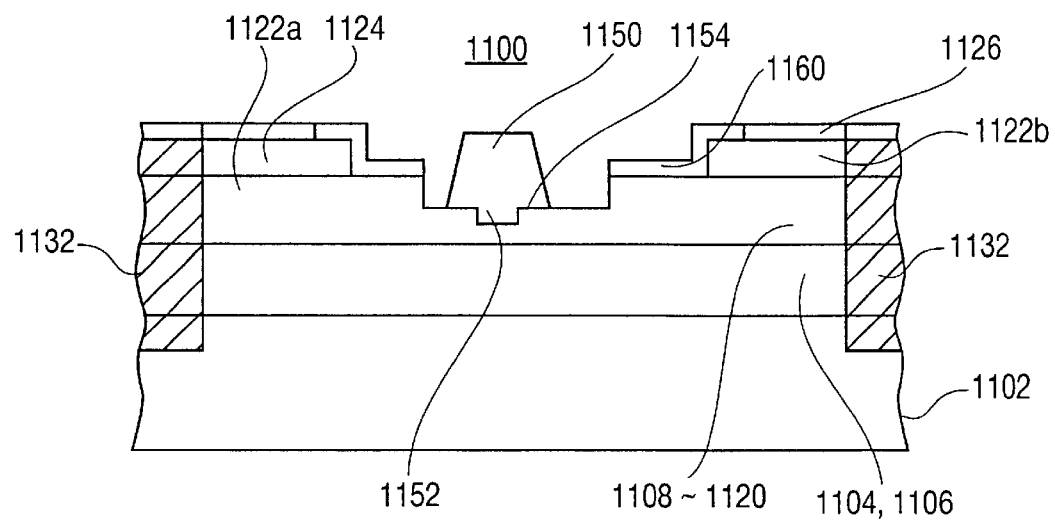
FIG. 22 is a schematic illustration in section of a step of the process of fabricating the semiconductor device, according to the eleventh embodiment of the invention.

Next, an eleventh embodiment of the invention described hereinafter with reference to FIGS. 20 to 22 relates to a number of processes of fabricating the PHEMT 300 according to the third embodiment, shown in FIG. 4. In the case of this embodiment as well, parts formed by the essentially same steps of the process as those for the embodiment previously described will be denoted by the same reference numerals at the lower two places, thereby avoiding duplicated explanation.

In fabricating the PHEMT 300 according to the third embodiment, the cap layer (n⁻GaAs) 920 is set to have a thickness about twice as thick in comparison with that for the PHEMIT 100 according to the first embodiment, in the same way as in the various steps of the process according to the ninth embodiment. Then, through the various steps already described, the structure illustrated in the step of the process described with reference to FIG., 17 is formed. Subsequently, as shown in FIG. 20, a first patterned photoresist 1136a, having an opening with a length L6, about 2.5 μm long, is formed by use of an i-line positive photoresist. By use of the fist patterned photoresist 1136a as a mask, a spacer insulation film layer 1160 is etched Only a cap layer (n⁻GaAs) 1120, exposed in an opening 1160a of the spacer insulation film layer 1160, is etched Such etching treatment is applied with the use of an etchant having chemical selectivity not to etch a Schottky layer ($\Phi^{31}$ AlGaAs) 1118. Subsequently, as shown FIG. 21, a second patterned photoresist 1136b, having an opening in an overhanging shape in a sectional view, is formed by use of an i-line negative photoresist. Thereafter, by applying the vacuum evaporation/lift-off method to a gate electrode material, a PHEMT 1100, as shown in FIG. 22, can be fabricated.

According to this embodiment, the cap layer (n⁻GaAs) 1120 of the epiwafer is set to have a thickness about twice as thick in comparison with that for the PHEMT 100 according to the first embodiment. Further, a narrow groove is formed for shaping the bottom part of a gate electrode 1150 into a two-level structure. The opening of the photoresist is formed asymmetrically against the groove. After etching the spacer insulation film layer 1160 exposed in the opening 1160a, the cap layer (n⁻GaAs) 1120 is etched to about half of the thickness thereof. Subsequently, by applying the vacuum evaporation/lift-off method to the gate electrode material, the PHEMT 1100 according to the eleventh embodiment can be fabricated.

[Twelfth Embodiment]

Next, a process of fabricating the PHEMT 400 of the fourth embodiment, shown in FIG. 5, according to a twelfth embodiment of the invention is described hereinafter. In the case of this embodiment as well, parts formed by the essentially same steps of the process as those for the embodiment previously described will be denoted by the same reference numerals at the lower two places, thereby avoiding duplicated explanation.

In fabricating the structure shown in FIG. 9 for illustrating one of the various steps in the process of fabricating the semiconductor device, according to the eighth embodiment of the invention., the cap layer (n⁻GaAs) 820 of the epiwafer is set to have a thickness about twice as thick in comparison with that for the PHEMT 100 according to the first embodiment. After completion of the various steps described with reference to FIGS. 10 to 16, FET properties are measured with the use of respective exposed electrodes such as the source electrode 824, the gate electrode 850, and the drain electrode 826. In this state, although source resistance is sufficiently small and mutual conductance gm is large, breakdown voltage in reverse between the gate and the drain is small Subsequently, the cap layer (n⁻GaAs) 820 exposed in gaps between the gate electrode 850 and the edges of the spacer insulation film layer 860, as shown in FIG. 16, is etched, and FET properties are measured again. As a result of etching of the cap layer (n⁻GaAs) 820, the reverse breakdown voltage between the gate and the drain and the source resistance starts rising while the mutual conductance gm starts declining. Thus, the etching and measurement of the FET properties are repeated, and when FET properties as desired are obtained, the fabrication process is completed.

As described above, with this embodiment, the cap layer (n⁻GaAs) 820 of the epiwafer is set to have a thickness about twice as thick in comparison with that for the PHEMT 100 according to the first embodiment. Taking advantage of the gaps between the opposite edges 854 of the gate electrode 850 and the edges of the spacer insulation film layer 860, the cap layer (n⁻GaAs) 820 exposed therebetween is etched while FET properties are being watched, and a thickness thereof can be adjusted step by step to about half (design value) of the set thickness. Consequently, electrical characteristics with high repeatability can be obtained.

[Thirteenth Embodiment]

Next, a process of fabricating the PHEMT 500 of the fifth embodiment, shown in FIG. 6, according to a thirteenth embodiment of the invention is described hereinafter. In the case of this embodiment as well, parts formed by the essentially same steps of the process as those for the embodiment previously described will be denoted by the same reference numerals at the lower two places, thereby avoiding duplicated explanation.

Figure 23:
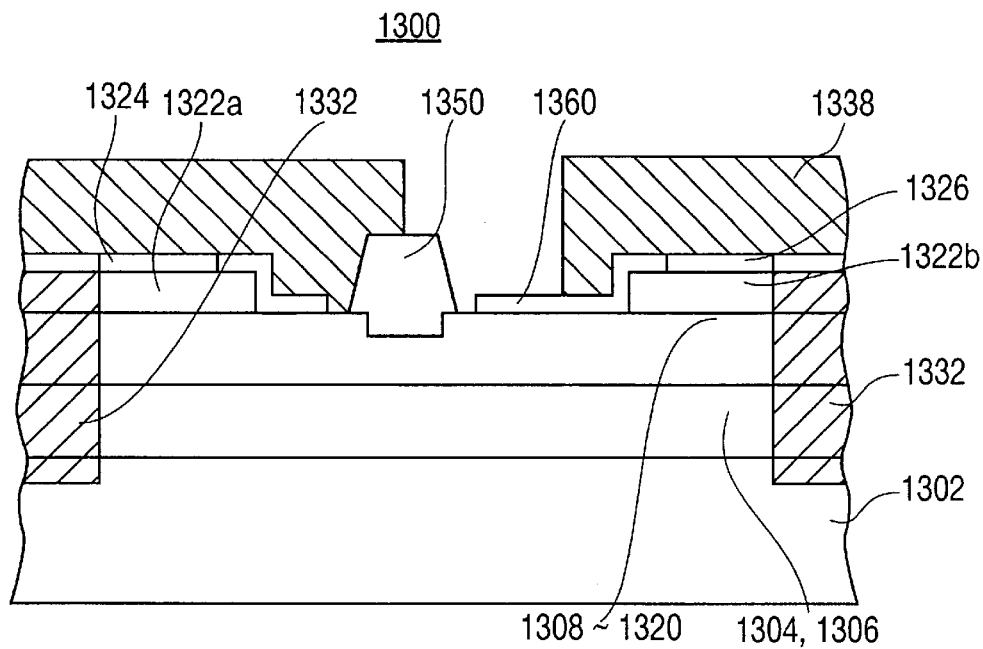
FIG. 23 is a schematic illustration in section of a step of a process of fabricating a semiconductor device, according to a thirteenth embodiment of the invention.
Figure 24:
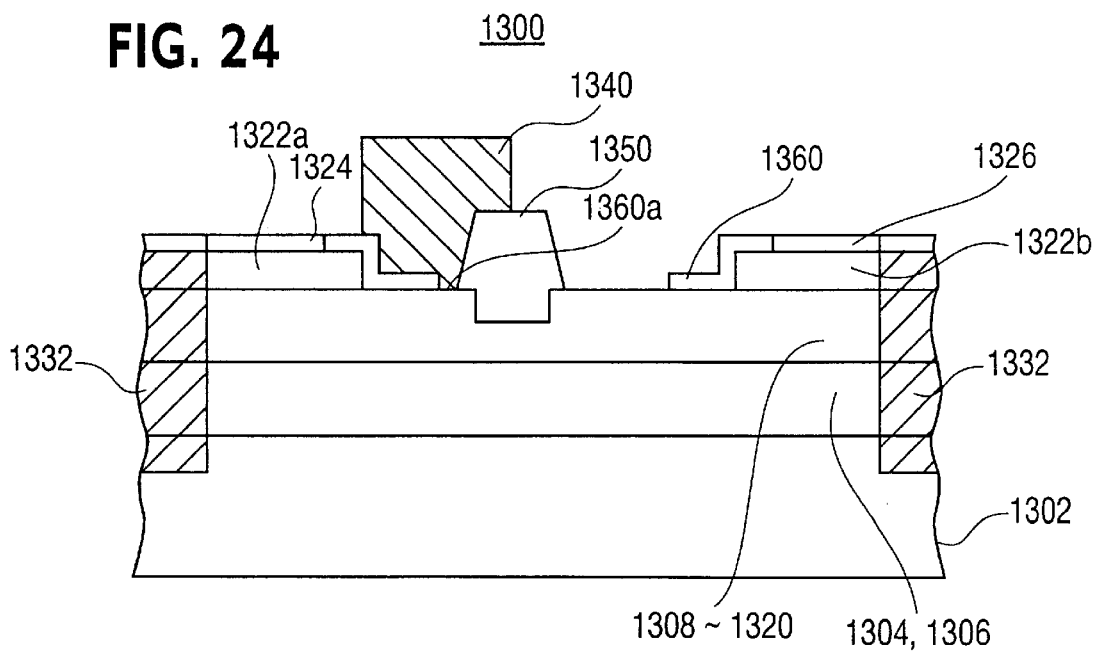
FIG. 24 is a schematic illustration in section of a step of the process of fabricating the semiconductor device, according to the thirteenth embodiment of the invention.

As with the case of the various steps in the process of fabricating the semiconductor device, according to the eighth embodiment of the invention, a cap layer (n⁻GaAs) of an epiwafer is set to have a thickness about twice as thick in comparison with that for the PHEMT 100 according to the first embodiment. After completion of the various steps described with reference to FIGS. 9 to 16, in sequence, a patterned photoresist 1338 shown in FIG. 23 is formed with an opening provided in a region by a gate electrode 1350, on the side of a drain electrode 1326. A portion of a spacer insulation film layer 1360, exposed to the opening, is removed by etching. Subsequently, as shown in FIG. 24, a patterned photoresist 1340 is additionally formed so as to cover a gap 1360a in the spacer insulation film layer 1360, between the gate electrode 1350 and a source electrode 1324. Thereafter, FET properties are measured with the use of respective exposed electrodes such as the source electrode 1324, the gate electrode 1350, and the drain electrode 1326. In this state, source resistance is sufficiently small, and mutual conductance gm is large, but reverse breakdown voltage between the gate and the drain is small.

Subsequently, as shown in FIG. 24, etching is applied to a cap layer (n⁻GaAs) 1320, exposed in a gap between the gate electrode 1350 and the edge of the spacer insulation film layer 1360, on the side of the drain electrode 1326. Then, the FET properties are measured again. As a result of etching of the cap layer (n⁻GaAs) 1320, the reverse breakdown voltage between the gate electrode 1350 and the drain electrode 1326 starts rising, but neither the source resistance nor the mutual conductance gm changes. The etching and measurement of the FET properties are repeated, and when FET properties as desired are obtained, the fabrication process is completed.

Thus, with this embodiment, the cap layer (n⁻GaAs) of the epiwafer is set to have a thickness about twice as thick in comparison with that for the PHEMT 100 according to the first embodiment. A gap formed between the edge of the gate electrode 1350 and the edge of the spacer insulation film layer 1360 is provided on the side of the drain electrode 1326 only. Taking advantage of the gap, the cap layer (n⁻GaAs) 1320 exposed thereto is etched while FET properties are being watched, and by adjusting the cap layer so as to have a thickness equivalent to about half (design value) of the set thickness, electrical characteristics with high repeatability can be obtained.

[Fourteenth Embodiment]

Figure 25:
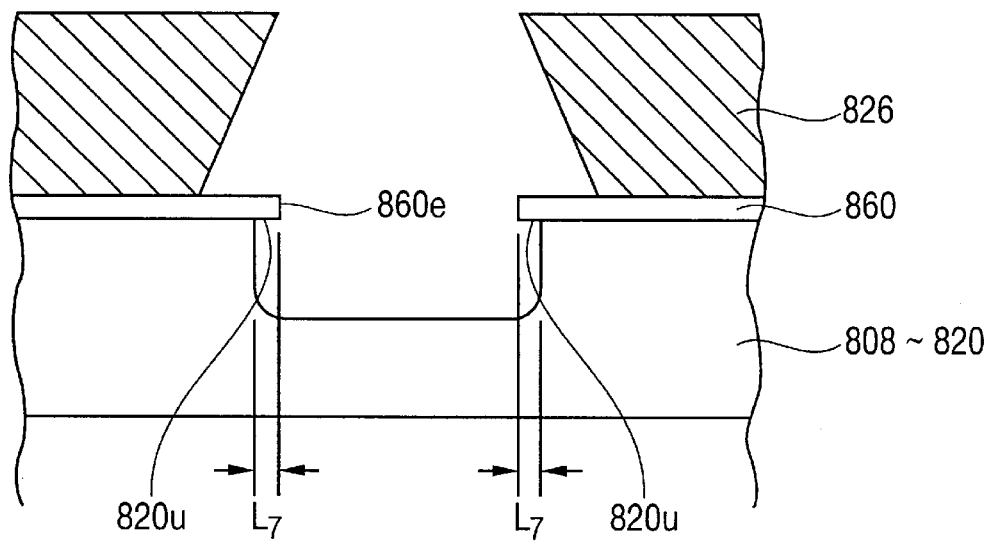
FIG. 25 is an enlarged section view of an etching region during a step of the process of fabricating the semiconductor device, according to the eighth embodiment of the invention.

The fourteenth embodiment relates to a process of fabricating a semiconductor device having the substantially same construction as that of the PHEMT 600 according to the sixth embodiment of the invention. As with the case of the various steps in the process of fabricating the semiconductor device, according to the eighth embodiment of the invention, the steps described with reference to FIGS. 9 to 14 are completed in sequence. Here, FIG. 25, indicating an enlarged view of an etching area A of the structure illustrated in FIG. 14, shows that in etching regions for the edges 860e of the spacer insulation film layer 860, and the cap layer (n⁻GaAs) 820, there exist minuscule offset parts, that is, undercut parts 820u due to side-etching. The undercut parts 820u are developed due to presence of an isotropic component, although small in magnitude, of plasma movement King etching using a gas containing $^{12}$carbon. If vapor deposition of a gate metal is carried out with the undercut parts 820u left as they are, there is a risk of the gate metal not being deposited on parts of the side walls of the cap layer (n⁻GaAs) 820, in the undercut parts 820u under the shade of the spacer insulation film layer 860.

Figure 26:
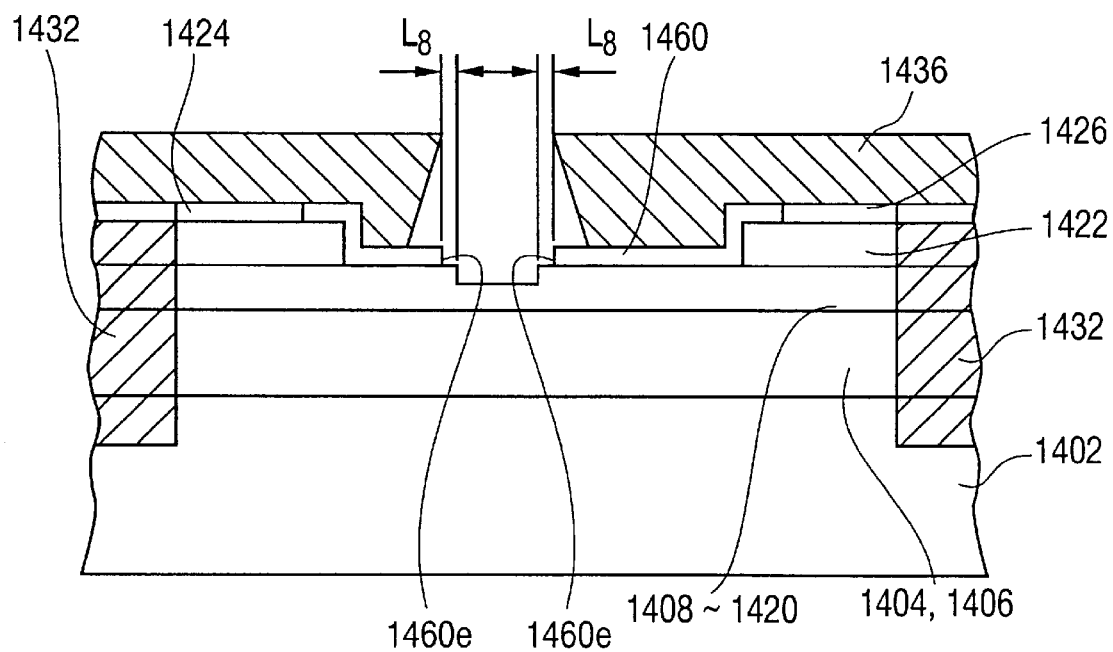
FIG. 26 is a schematic illustration in section of a step of a process of fabricating a semiconductor device, according to a fourteenth embodiment of the invention.
Figure 27:
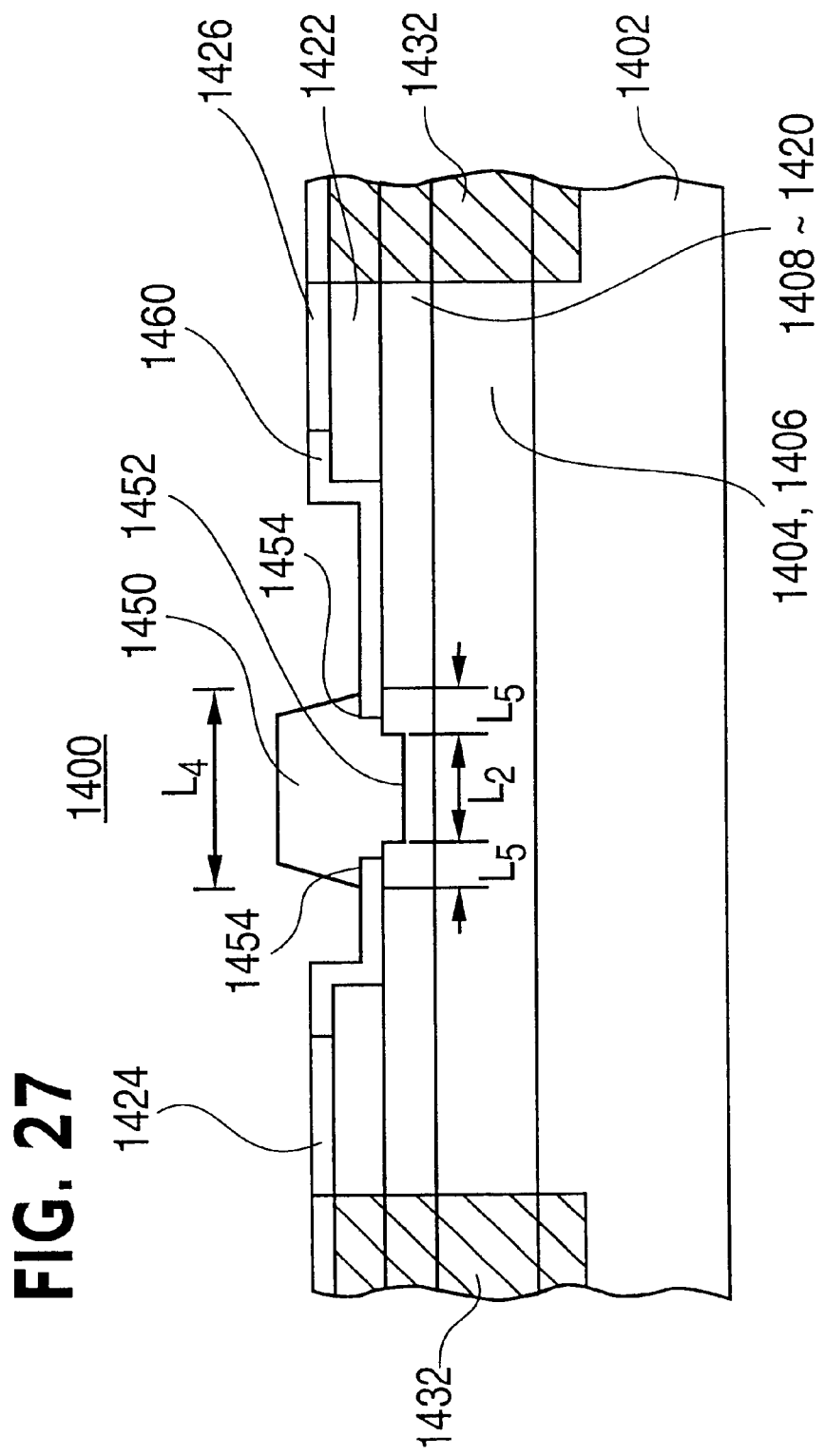
FIG. 27 is a schematic illustration in section of a step of the process of fabricating the semiconductor device, according to the fourteenth embodiment of the invention.

In order to prevent such a situation from occurring, immediately upon completion of the step shown in FIG. 14, gas used for the RIE system is changed over to $O_2$, and as shown in FIG. 26, isotropic ashing is applied to a patterned photoresist 1436 by $O_2$ plasma treatment. Then, the edges of an opening formed in the patterned photoresist 1436 are set back by a length L8, for example, about 0.1 μm, on both sides. Subsequently, the edges 1460e of an opening of the spacer insulation film layer 1460 are set back so as to correspond to the opening of the patterned photoresist 1436 by etching by means of RIE using $SF_6$. Thereafter, a material for the gate electrode 1450 is formed into a shape as shown in FIG. 27 by the vacuum evaporation lift-off method, thereby completing a PHEMT 1400. In this embodiment, a length L4 between opposite edges 1454 of the gate electrode 1450 is about 1.0 μm, and a length L2 of the bottom of the gate electrode 1450 is about 0.55 μm, equivalent to same in the case of the eighth embodiment.

Thus, with this embodiment, by means of anisotropic etching using the patterned photoresist 1436 with the opening for forming the gate electrode 1450 as a mask, the opening of the equivalent dimensions is provided in the spacer insulation film layer 1460. Further, a portion of a cap layer (n⁻GaAs) 1420 is removed by use of the patterned photoresist 1436 with the opening. A portion of a Schottky layer 1418 underneath the cap layer is also etched Thereafter, the edges of the opening formed in the patterned photoresist 1436 are set back by L8, respectively, and the edges 1460e of the opening of the spacer insulation film layer 1460 are also set back. By use of a photoresist with an opening formed between the edges 1460e which are set back, the gate electrode 1450 is formed by the vacuum evaporation/lift-off method. As a result, since continuous processing can be executed without taking the wafer into the atmosphere out of the reaction chamber of the RIE system, there is no risk of reaction products deposited on the wafer coming in contact with moisture, and so forth in the atmosphere, generating by-products interfering with the etching process. Accordingly, underlay processing with good repeatability can be carried out, and the PHEMT 1400 can be fabricated wherein the chemically unstable Schottky layer (Φ-AlGaAs) 1418 is not allowed to be exposed at all because the opposite edges 1454 of the gate metal overlie fully the surface of the cap layer (n⁻GaAs) 1420.

[Fifteenth Embodiment]

The fourteenth embodiment relates to a process of fabricating a semiconductor device according to the seventh embodiment of the invention. As with the case of the various steps in the process of fabricating the semiconductor device, according to the fourteenth embodiment, the cap layer (n⁻GaAs) of the epiwafer shown in FIG. 9 is set to have a thickness about twice as thick in comparison with that for the PHEMT 100 according to the first embodiment. Further, the steps described with reference to FIGS. 10 to 14 are carried out in sequence. Thereafter, the steps shown in FIGS. 26 and 27 are implemented, forming a gate electrode 1350 as desired. Then, as with the case of the various steps in the process of fabricating the semiconductor device, according to the thirteenth embodiment, the step shown in FIG. 23 is carried out, and a patterned photoresist 1338 is formed. The photoresist is then provided with an opening in a region by the gate electrode 1350, on the side of a drain electrode 1326. A portion of a spacer insulation film layer 1360, exposed to the opening, is removed by etching. After removal of the patterned photoresist 1338, FET properties are measured with the use of respective exposed electrodes such as a source electrode 1324, the gate electrode 1350, and the drain electrode 1326. In this state, a source resistance is sufficiently small and a mutual conductance gm is large, but a reverse breakdown voltage between the gate and the drain is small.

Subsequently, etching is applied to a cap layer (n⁻GaAs) 1320, exposed in a gap between the gate electrode 1350 and the edge of the spacer insulation film layer 1360, on the side of the drain electrode 1326. Then, the FET properties are measured again. As a result of etching of the cap layer (n⁻GaAs) 1320, the reverse breakdown voltage between the gate electrode 1350 and the drain electrode 1326 starts rising, but neither the source resistance nor the mutual conductance gm changes. The etching and measurement of the FET properties are repeated, and when FET properties as desired are obtained, the fabrication process is completed.

Thus, with this embodiment, the cap layer (n⁻GaAs) of the epiwafer is set to have a thickness about twice as thick in comparison with that for the PHEMT 100 according to the first embodiment. A gap formed between the edge of the gate electrode 1350 and the edge of the spacer insulation film layer 1360 is provided on the side of the drain electrode 1326 only. Taking advantage of the gap, a portion of the cap layer (n⁻GaAs) 1320, exposed on the side of the drain electrode 1326, is etched while the FET properties are being watched, and a thickness of the cap layer can be adjusted so as to be equivalent to about half (design value) of the set thickness. Consequently, with less number of process steps, electrical characteristics as desired with high repeatability can be obtained. Also, a portion of gate capacitance developed at the edges of the gate electrode 1350 can be reduced.

[Sixteenth Embodiment]

Figure 28:
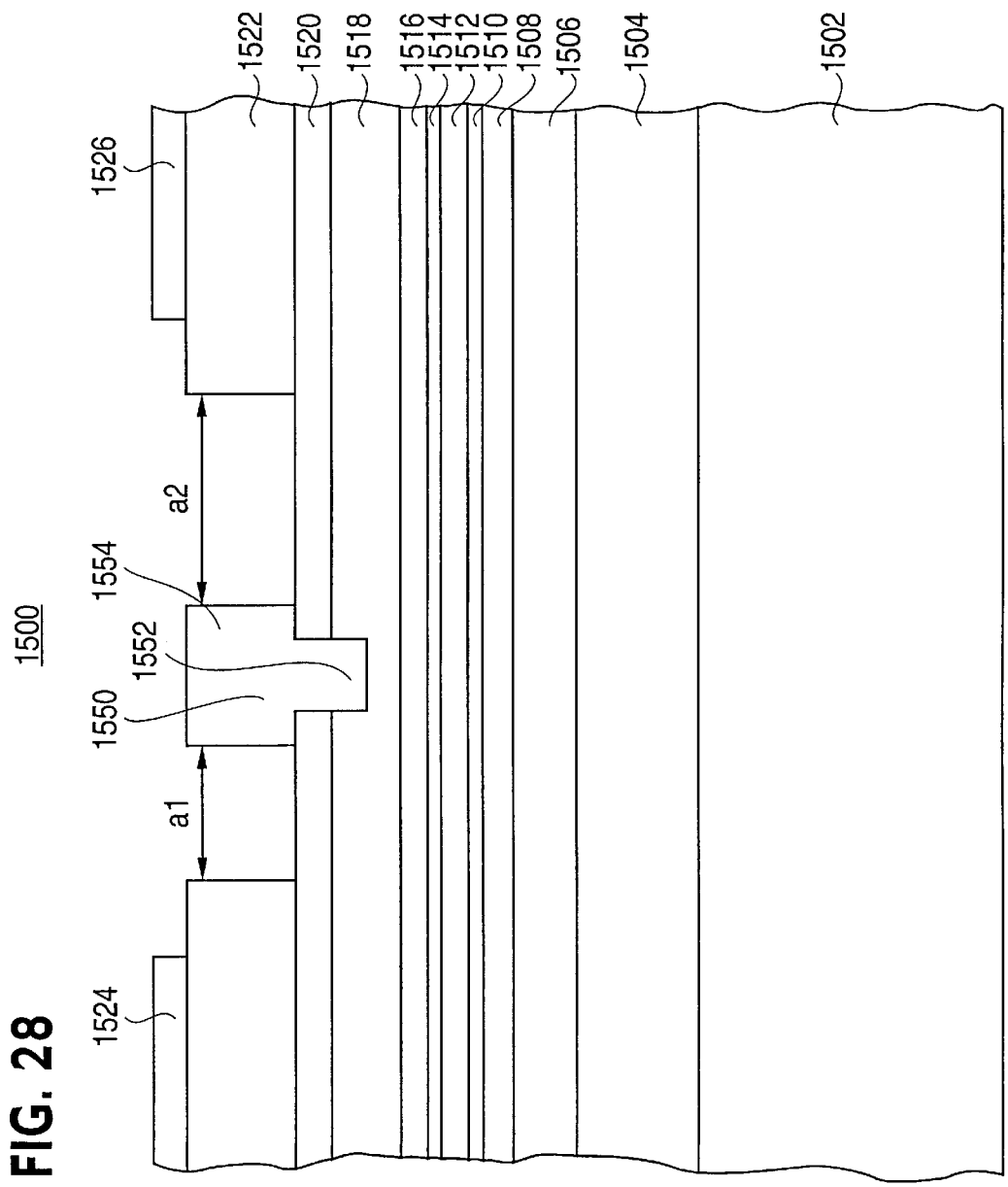
FIG. 28 is a schematic sectional view showing a structure of a PHEMT according to a sixteenth embodiment of the invention.

FIG. 28 is a schematic sectional view showing a structure of a PHEMT 1500 according to a sixteenth embodiment of the invention. As shown in the figure, the PHEMT 1500 comprises a substrate 1502, composed of semi-insulating GaAs, on top of which a first buffer layer 1504, composed of $\Phi^-$GaAs, a second buffer layer 1506, composed of $\Phi^-$AlGaAs, a first electron supply layer 1508, composed of n$^+$AlGaAs, a first spacer 1510, composed of $\Phi^-$AlGaAs, a channel layer 1512, composed of ($\Phi^-$InGaAs, a second spacer 1514, composed of $\Phi^-$AlGaAs, and a second electron supply layer 1516, composed of n$^+$AlGaAs, are deposited in that order. Further, a Schottky layer 1518, composed of $\Phi^-$AlGaAs, is formed to a thickness of about 500 angstroms on the second electron supply layer 1516, and a cap layer 1520, composed of $\Phi^-$GaAs, is formed to a thickness of about 250 angstroms further on the Schottky layer 1518. Here, $\Phi^-$GaAs is GaAs without any n-type dopant such as silicon implanted $\Phi^-$GaAs industrially produced by molecular beam epitaxy (MBE), used in carrying out this embodiment, is of p-type and has hole density at about $1 \times 10^{15}$ cm$^{-3}$.

Then, n$^+$ layers 1522, composed of n$^+$GaAs are formed to a thickness of 1000 angstroms on the cap layer 1520 at donor density of about 4E 18 cm$^{-3}$, in regions where ohmic electrodes are formed. Further, on top of the n$^+$ layers 1522, a first ohmic electrode 1524 and a second ohmic electrode 1526 are formed, respectively. The fist ohmic electrode 1524 shown on the left-hand side in the figure is constructed to serve as a source electrode, and the second ohmic electrode 1526 shown on the right-hand side in the figure to serve as a drain electrode. Furthermore, a gate electrode 1550, which is a Schottky electrode according to this embodiment, is formed between the source electrode 1524 and the drain electrode 1526.

As shown in the sectional view, the gate electrode 1550 consists of an under structure and an upper structure, formed in steps. The under structure 1552 in a stepped part thereof penetrates through the cap layer 1520, reaching the Schottky layer 1518. Further, the upper structure 1554 is formed as if it was overlying the cap layer 1520. In this embodiment, the stepped part of the gate electrode 1550 can be formed such that a difference in level is, for example, on the order of 500 angstroms. In this embodiment, a spacing a1 between the n$^+$ layer 1522 on the side of the source and the gate electrode 1550 is, for example, on the order of 0.4 μm. A spacing a2 between the n$^+$ layer 1522 on the side of the drain and the gate electrode 1550 is, for example, on the order of 0.6 μm. The spacings, a1 and a2, are set to be not more than half of the spacing between the n$^+$ layer 122 on the side of the source and the gate electrode 150, and same between the n$^+$ layer 122 on the side of the drain and the gate electrode 150, according to the first embodiment, respectively.

Since the operation of the PHEMT 1500 according to this embodiment is substantially same as for the PHEMT 100 according to the first embodiment, description thereof is omitted.

As with the case of the first embodiment, with the PHEMT 1500 in amplification operation, the source electrode 1524 is grounded and a positive voltage (Vds) is applied to the drain electrode 1526 while a negative voltage (Vgs) is applied to the gate electrode.

Properties required of the PHEMI in this case are large mutual conductance gm=d(Ids)/d(Vds), small on-resistance Ron=d(Vds)/d(Ids), small leak current Igso between the source and the gate, and large reverse breakdown voltage (BVgd) between the gate and the drain; here d signifies an infinitestimal change.

Figure 29:
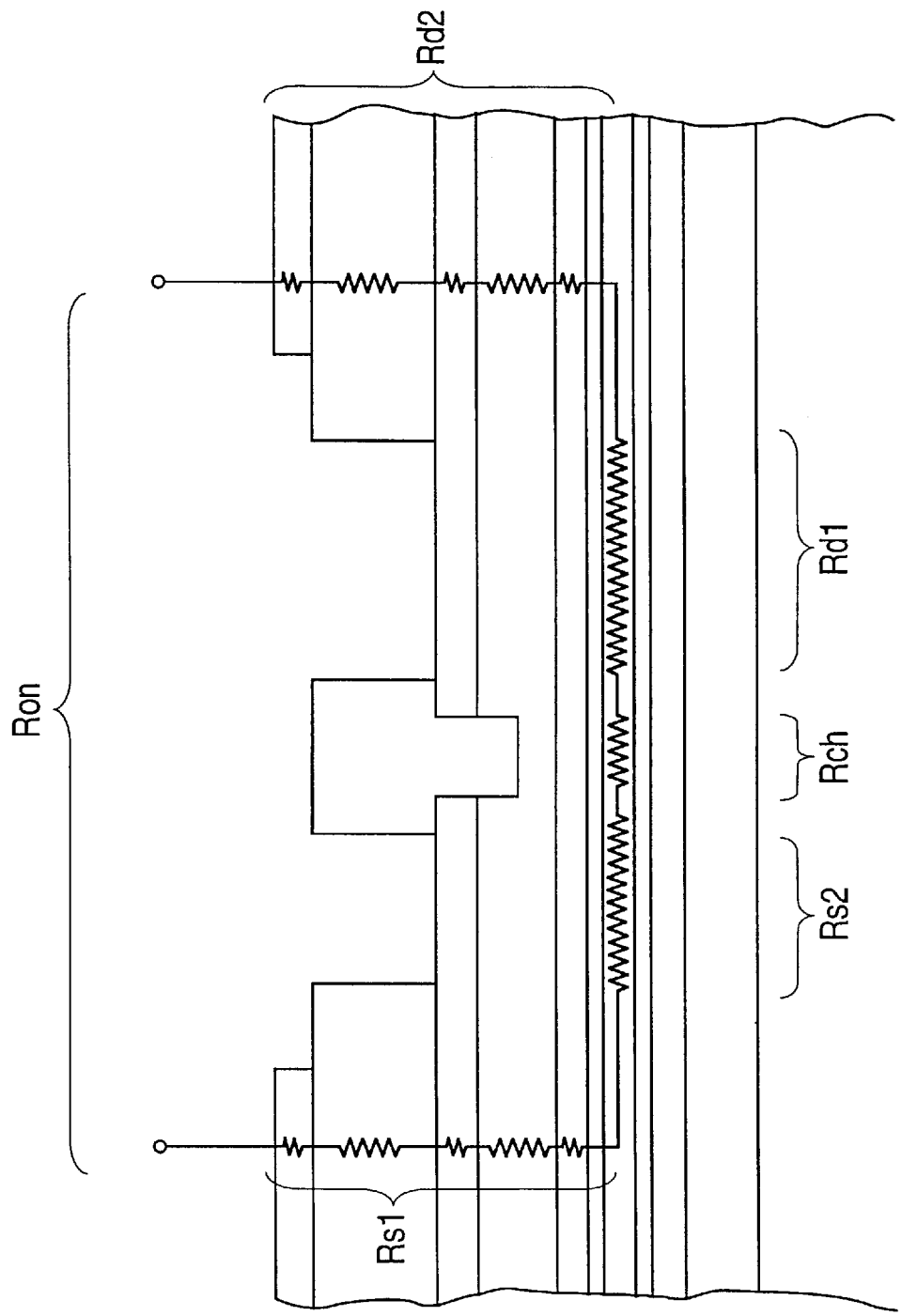
FIG. 29 is a schematic illustration showing respective resistance components of on-resistance of the PHEMT shown in FIG. 28.

FIG. 29 is a schematic illustration showing respective resistance components of on-resistance Ron of the PHEMT. The on-resistance Ron consists of the following respective resistance:

$$Ron = Rs1 + Rs2 + Rch + Rd1 + Rd2$$

where Rs1 and Rd2 are resistance in a vertical direction from the source electrode 1524 and the drain electrode 1526, respectively, to the channel layer 1512, and Rs2, Rch, and Rd1 are resistance in a lateral direction within the channel layer 1512.

In this embodiment, the cap layer 1520 is composed of $\Phi^-$GaAs while the cap layer 120 of the first embodiment is composed of n$^-$GaAs. Further, in this embodiment, resistance of the cap layer 1520, constituting a portion of Rs1 and Rd2, respectively, is larger than that for the cap layer 120 of the first embodiment. However, among the respective resistance components making up. Rs1 and Rd2, resistance components of the Schottky layer 1518 are by far larger than those of other layers, and consequently, an increase in Rs1 and Rd2, respectively, can be held down to about 5%.

Further, as described in the foregoing, the spacing a1 between the n$^+$ layer 1522 on the side of the source and the gate electrode 1550, and the spacing a2 between the n$^+$ layer 1522 on the side of the drain and the gate electrode 1550 are set to be not more than half of those for the first embodiment, respectively.

Consequently, in this embodiment, Rs2 and Rd1 are reduced by 60%, respectively, in comparison with those in the first embodiment. As a result, Ron for this embodiment is 40% less than that for the first embodiment.

Now, assuming that in this embodiment, the spacing between the n$^+$ layer 1522 on the side of the source and the gate electrode 1550 and the same between the n$^+$ layer 1522 on the side of the drain and the gate electrode 1550 are equivalent to those for the first embodiment, the leak current Igso between the source and the gate, flowing from the source to the gate, will become smaller in this embodiment, and the BVgd higher in this embodiment. Taking into account a fact that the spacing between the n$^+$ layer 1522 on the side of the source and the gate electrode 1550 for this embodiment is about half of that for first embodiment, and the spacing between the n$^+$ layer 1522 on the side of the drain and the gate electrode 1550 for this embodiment is about half of that for the first embodiment, it is possible to maintain the leak current Igso between the source and the gate, and the breakdown voltage between the gate and the drain, for this embodiment, substantially at the same level as the leak current Igso between the source and the gate, and the breakdown voltage between the gate and the drain for the first embodiment.

The mutual conductance gm can be represented by:

$$1/gm = 1/gm0 + Rs1 + Rs2$$

where
gm0=intrinsic gm directly under the gate, and
source resistance=Rs1+Rs2.

In this embodiment, Rs1+Rs2 is considerably reduced in comparison with same for the first embodiment. Consequently, the gm for this embodiment is increased by 20% over the gm for the first embodiment.

Further, capacitance developed by the gate electrode 1550 against the cap layer 1520 composed of $\Phi^-$GaAs is smaller than capacitance developed by the gate electrode 150 against the cap layer 120 composed of n⁻ GaAs. Accordingly, with this embodiment, capacitance Cgs between the gate and the source, and capacitance Cgd between the gate and the drain, containing the aforesaid capacitance as a constituent, respectively, can be rendered smaller those for the first embodiment.

In this embodiment, the cap layer composed of Φ⁻GaAs is shown. A cap layer composed of GaAs, whether n-type or p-type, as long as carrier density thereof is 1×10¹⁶ cm⁻³ may be used for achieving improvement on the leak current Igso between the source and the gate or the breakdown voltage BVgd between the gate and the drain, as indicated in this embodiment.

The reason for this is as follows. A length Ldp of a depletion layer of a Schottky barrier formed between the gate electrode and the cap layer is represented by the following expression:

$$Ldp = \{2\epsilon s(Vbi - V - kT/q)/qNx\}^{1/2}$$

where
- εs=dielectric constant of the cap layer,
- Vbi=built-in potential,
- V=voltage between the source and the gate, or voltage between the drain and the gate,
- k=Boltzmann constant,
- T=absolute temperature,
- q=elementary electric charge, and
- Nx=donor or acceptor density.

Assuming that V=0, if Nx=10¹⁶ cm⁻³ at room temperature, Ldp=0.33 µm, and if Nx=10¹⁵ cm⁻³, Ldp=1 µm.

More specifically, if Nx=10¹⁵ cm⁻³, the cap layer is completely depleted at a gate bias voltage of 0V, and if Nx=10¹⁶ cm⁻³, the cap layer is completely depleted at a gate bias voltage to the source of negative several volts. Accordingly, the leak current of the gate electrode is reduced, increasing the breakdown voltage between the gate and the drain.

As described above, with the PHEMT 1500 according to the sixteenth embodiment, wherein the cap layer 1520 is composed of Φ⁻GaAs, the spacing between the source electrode and the gate electrode, and same between the drain electrode and the gate electrode can be shortened while maintaining the leak current Igso between the source and the gate, and the breakdown voltage BVgd between the gate and the drain substantially at the same level as that for those of the first embodiment. Consequently, the properties of the PHEMT 1500 such as the on-resistance Ron and the mutual conductance gm are improved.

[Seventeenth Embodiment]

Figure 30:
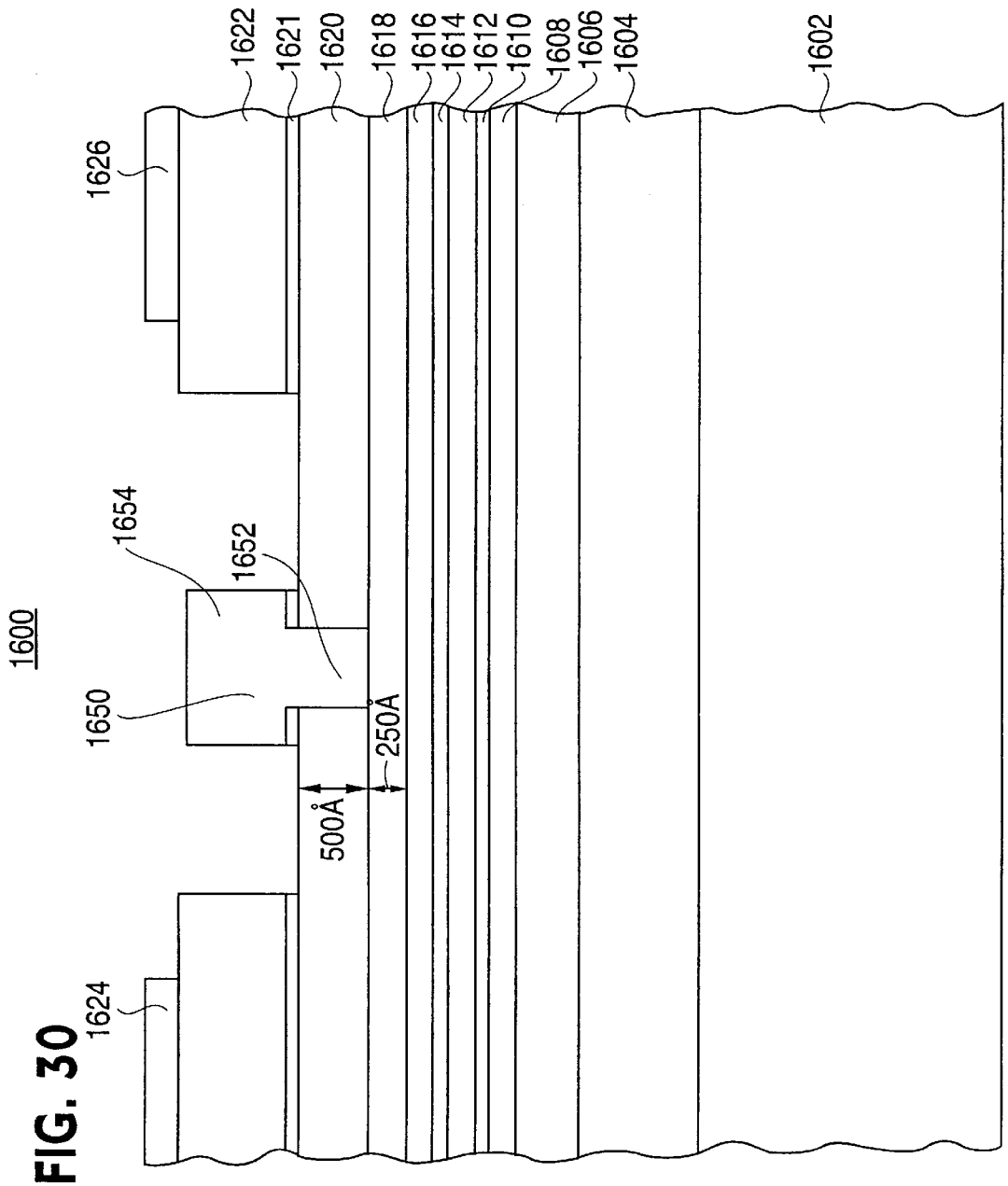
FIG. 30 is a schematic sectional view showing a structure of a PHEMT according to a seventeenth embodiment of the invention.

FIG. 30 is a schematic sectional view showing a structure of a PHEMT 1600 according to a seventeenth embodiment of the invention.

As shown in the figure, the PHEMT 1600 comprises a substrate 1602, composed of semi-insulating GaAs, on top of which a first buffer layer 1604, composed of Φ⁻GaAs, a second buffer layer 1606, composed of Φ⁻AlGaAs, a first electron supply layer 1608, composed of n⁺AlGaAs, a first spacer 1610, composed of Φ⁻AlGaAs, a channel layer 1612, composed of Φ⁻InGaAs, a second spacer 1614, composed of Φ⁻AlGaAs, and a second electron supply layer 1616, composed of n⁺AlGaAs, are deposited in that order. Further, a Schottky layer 1618, composed of Φ⁻AlGaAs, is formed to a thickness of about 250 angstroms on the second electron supply layer 1616, and a cap layer 1620, composed of Φ³¹ GaAs, is formed to a thickness of about 500 angstroms further on the Schottky layer 1618. Here, Φ⁻GaAs is GaAs without any n-type dopant such as silicon implanted. Φ⁻GaAs industrially produced by molecular beam epitaxy (MBE), used in carrying out this embodiment, is of p-type and has hole density at about 1×10¹⁵ cm⁻³.

Further, an etch-stop layer 1621 composed of n⁻AlGaAs is formed to a thickness of 30 angstroms on the cap layer 1620 at donor density of 4E 18 cm⁻³.

Then, n⁺ layers 1622, composed of n⁺GaAs, are formed to a thickness of 1000 angstroms on the cap layer 1620 at donor density of about 4E 18 cm⁻³, in regions where ohmic electrodes are formed. Further, on top of the n⁺ layers 1622, a first ohmic electrode 1624 and a second ohmic electrode 1626 are formed, respectively. The first ohmic electrode 1624 shown on the left-hand side in the figure is constructed to serve as a source electrode, and the second ohmic electrode 1626 shown on the right-hand side in the figure to serve as a drain electrode. Furthermore, a gate electrode 1650, which is a Schottky electrode according to this embodiment, is formed between the source electrode 1624 and the drain electrode 1626.

As shown in the sectional view, the gate electrode 1650 consists of an under structure and an upper structure, formed in steps. The under structure 1652 in the stepped part thereof penetrates through the etch-stop layer 1621 and the cap layer 1620, reaching the Schottky layer 1618. Further, the upper structure 1654 is formed as if it was overlying the etch-stop layer 1621 and the cap layer 1620. In this embodiment, the stepped part of the gate electrode 1650 can be formed such that a difference in level is, for example, on the order of 530 angstroms.

In this embodiment, a spacing between the n⁺ layer 1622 on the side of the source and the gate electrode 1650 is, for example, on the order of 0.4 µm, and a spacing between the n⁺ layer 1622 on the side of the drain and the gate electrode 1650 is, for example, on the order of 0.6 µm. In this embodiment, the aforesaid spacings are set to be not more than half of the spacing between the n⁺ layer on the side of the source and the gate electrode, and same between the n⁺ layer on the side of the drain and the gate electrode, according to the first embodiment, respectively.

With the PHEMT 1600 according to this embodiment, the etch-stop layer 1621 composed of a material different from those for the n⁺ layer 1622 and the cap layer 1620 is formed therebetween, and it is therefore possible to selectively stop etching of the n⁺ layer 1622 and the etch-stop layer 1621 during a fabrication process. Accords, a thickness of the cap layer 1620 can be rendered as designed, so that a PHEMT having stable Cgs and Cgd can be fabricated.

[Eighteenth Embodiment]

Figure 31:
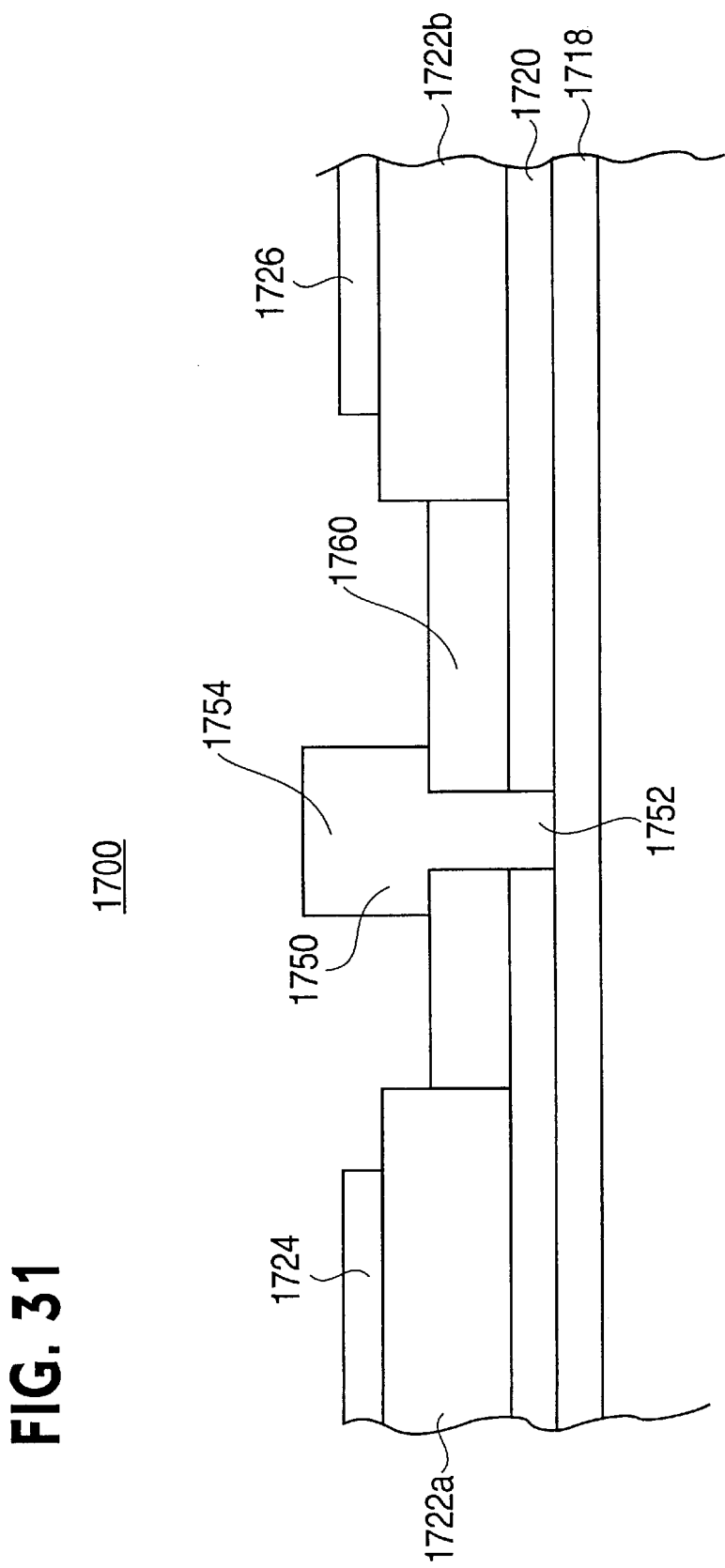
FIG. 31 is a schematic sectional view showing a structure of a PHEMT according to an eighteenth embodiment of the invention.

FIG. 31 is a schematic sectional view showing a PHEMT 1700 according to a eighteenth embodiment of the invention. As with the case of the sixteenth embodiment, with the PHEMT 1700 as well, a cap layer 1720, composed of Φ⁻GaAs, is formed to a thickness of about 250 angstroms on a Schottky layer 1718 composed of Φ⁻AlGaAs, and formed to a thickness of about 250 angstroms. Further, n⁺ layers 1722*a*, 1722*b*, composed of n⁺GaAs, at donor density of about 4E 18 cm⁻³, are formed to a thickness of 1000 angstroms on the cap layer 1720 in regions where ohmic electrodes are formed. Further, on top of the n⁺ layers 1722*a*, and 1722*b*, a first ohmic electrode 1724 and a second ohmic electrode 1726, to serve as a source electrode and a drain electrode, respectively, are formed.

This embodiment is characterized in that a spacer insulation film layer 1760 composed of SiO₂ is formed to a thickness of about 500 angstroms on the cap layer 1720, in a region between the n⁺ layers 1722a, and 1722b. A gate electrode 1750 is formed such that same is embedded in a recess penetrating through the spacer insulation film layer 1760 and the cap layer 1720 so as to be in contact with the Schottky layer 1718. That is, as with the case of the sixteenth embodiment, the gate electrode 1750 has a lower part formed in steps in a sectional view. A lower level 1752 thereof is in contact with the Schottky layer 1718 composed of Φ⁻AlGaAs, and an upper level 1754 overlies the spacer insulation film layer 1760. In this embodiment, the stepped part of the gate electrode 1750 is formed such that a difference in level is, for example, on the order of 750 angstroms to enable the lower level 1752 to reach the Schottky layer 1718 with ease. Further, the same structure as that for the sixteenth embodiment is fabricated underneath the Schottky layer 1718 although not shown.

The PHEMT 1700 according to the eighteenth embodiment, having the construction described as above, is the same as that according to the sixteenth embodiment except that the spacer insulation film layer 1760 is formed on top of the cap layer 1720, and the upper level 1754 of the gate electrode 1750 overlies the spacer insulation film layer 1760. According, the essentially same effect as that for the sixteenth embodiment can be obtained. Further, with this embodiment, the upper level 1754 of the gate electrode 1750 overlies the spacer insulation film layer 1760 composed of $SiO_2$ (dielectric constant 4) having a lower dielectric constant than that of GaAs, which is 13, so that substantially the same values as those for the sixteenth embodiment can be secured with respect to the mutual conductance gm and the breakdown voltage between the gate and the drain while reducing the capacitance Cgs between the gate and the source by about 2%.

[Nineteenth Embodiment]

Figure 32:
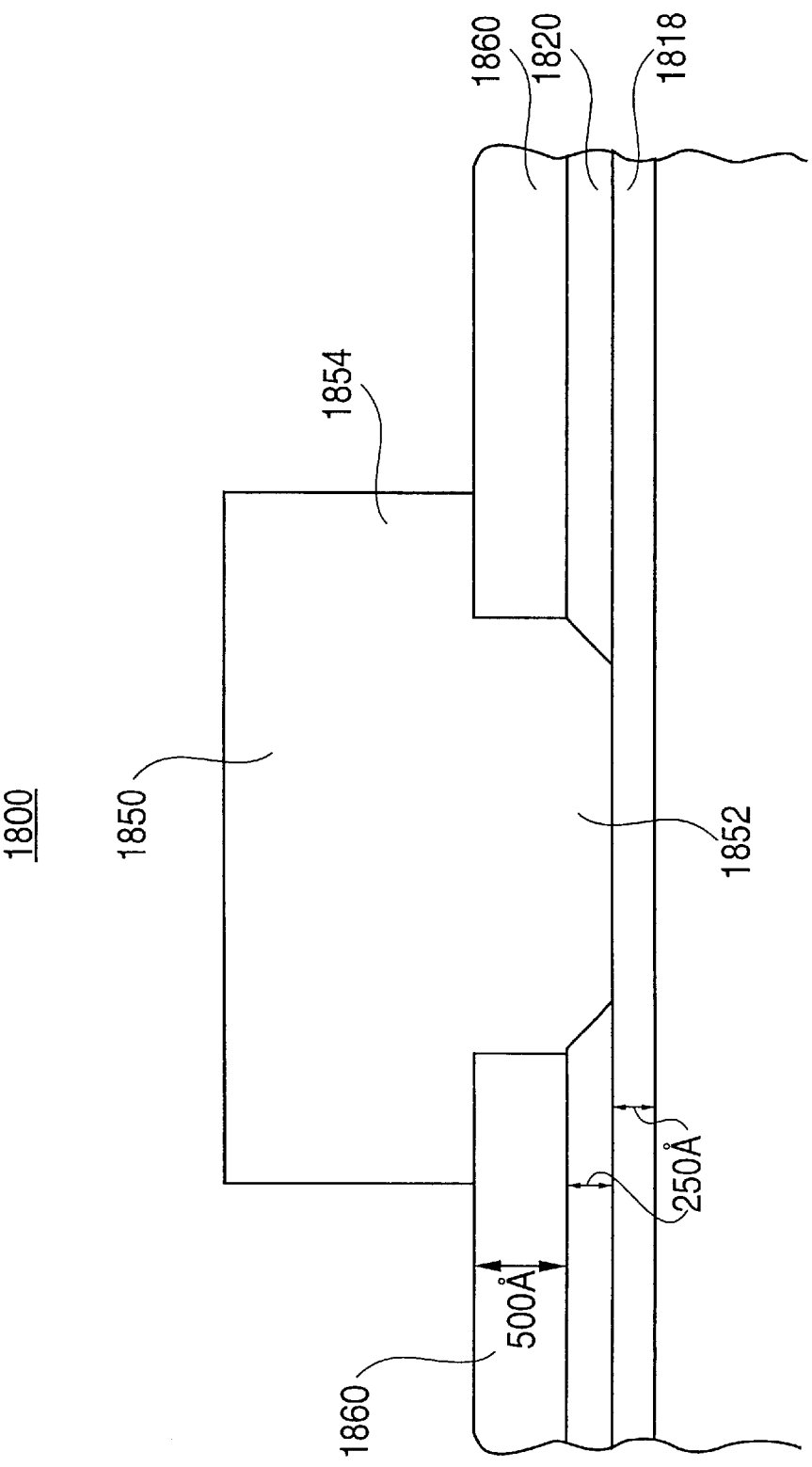
FIG. 32 is a schematic sectional view showing a structure of a PHEMT according to a nineteenth embodiment of the invention.

FIG. 32 is a schematic sectional view showing a PHEMT 1800 according to a nineteenth embodiment of the invention. As with the case of the sixteenth embodiment, with the PHEMT 1800 as well, a cap layer 1820, composed of Φ⁻GaAs, is formed to a thickness of about 250 angstroms on a Schottky layer 1818 composed of Φ⁻AlGaAs, and formed to a thickness of about 250 angstroms. Further, n⁺ layers (not shown), composed of n⁺GaAs, at donor density of about 4E 18 cm⁻³, are formed to a thickness of about 1000 angstroms on the spacer insulation film layer 1861, in regions where ohmic electrodes are formed. Further, on top of the n⁺ layers, ohmic electrodes (not shown) to serve as a source electrode and a drain electrode, respectively, are formed.

Further, the spacer insulation film layer 1860 composed of $SiO_2$ is formed to a thickness of about 500 angstroms on the cap layer 1820, in a region between the n⁺ layers on which the source electrode and the drain electrode are formed, respectively. A gate electrode 1850 is formed such that same is embedded in a recess penetrating through the spacer insulation film layer 1860 and the cap layer 1820 so as to be in contact with the Schottky layer 1818. That is, as with the case of the eighteenth embodiment, the gate electrode 1850 has a lower part formed in steps in a sectional view. A lower level 1852 thereof is in contact with the Schottky layer 1818 composed of Φ⁻AlGaAs, and an upper level 1854 overlies the spacer insulation film layer 1860. The stepped part of the gate electrode 1850 is formed such that a difference in level is, for example, on the order of 750 angstroms to enable the lower level 1852 to reach the Schottky layer 1818 with ease. Further, the same structure as that for the sixteenth embodiment is fabricated underneath the Schottky layer 1818 although not shown.

This embodiment is characterized in that the side walls of the cap layer 1820, in contact with the gate electrode 1850, are inclined at 45°. As a result, a length of a portion of the gate electrode, in contact with the Schottky layer, is shorter by 500 angstroms than that for the eighteenth embodiment. Assuming that a length of the gate electrode between the edges of the spacer insulation film layer is 0.55 μm in the eighteenth and nineteenth embodiments, a length of a portion of the gate electrode (gate length), in contact with the Schottky layer, in the case of the eighteenth embodiment, is 0.55 μm, but in this embodiment, a gate length will become 0.5 μm. Accordingly, with this embodiment, since the gate length is shorter by 10% than that for the eighteenth embodiment, it is possible to increase mutual conductance gm by 10%, and to reduce capacitance Cgs between the gate and the source by 10%.

[Twentieth Embodiment]

FIGS. 33 through 41 are cross-sectional representations of various steps in a process of fabricating a semiconductor device, according to a twentieth embodiment of the invention. The twentieth embodiment relates to a process of fabricating a semiconductor device 1900 having the substantially same construction as that of the PHEMT 1800 according to the sixteenth embodiment of the invention.

Figure 33:
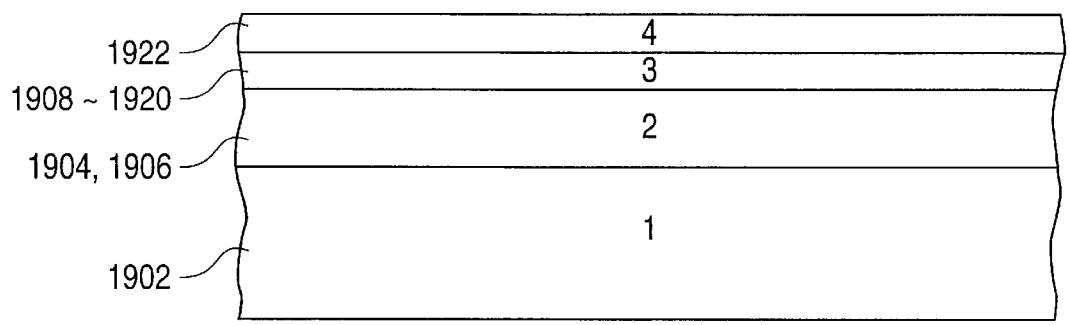
FIG. 33 is a schematic illustration in section of a step of a process of fabricating a semiconductor device, according to a twentieth embodiment of the invention.

As shown in FIG. 33, an epiwafer 1900 with all the compound semiconductor layers corresponding to those of the PHEMT 1500 according to the sixteenth embodiment, formed thereon through epitaxial growth, is first fabricated on a semi-insulating GaAs substrate 1902 by means of the molecular beam epitaxy (MBE). More specifically, as shown in the figure by way of example, the epiwafer 1900 comprises the semi-insulating GaAs substrate 1902, on top of which a first buffer layer 1904, composed of Φ⁻GaAs, a second buffer layer 1906, composed of Φ⁻AlGaAs, a first electron supply layer 1908, composed of $n^{30}$ AlGaAs, a first spacer 1910, composed of Φ⁻AlGaAs, a channel layer 1912, composed of Φ⁻InGaAs, a second spacer 1914, composed of Φ⁻AlGaAs, and a second electron supply layer 1916, composed of n⁺AlGaAs, a Schottky layer 1918, composed of Φ⁻AlGaAs, and a cap layer 1920, composed of Φ⁻GaAs, are deposited in that order. Further, on top of the cap layer 1920, a n⁺GaAs layer 1922 is deposited, making up the uppermost layer.

Figure 34:
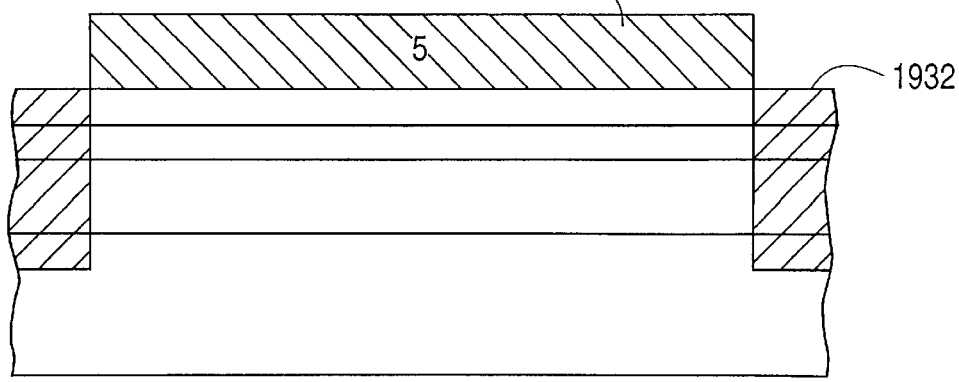
FIG. 34 is a schematic illustration in section of a step of the process of fabricating the semiconductor device, according to the twentieth embodiment of the invention.

Next, as shown in FIG. 34, a patterned photoresist 1930 with necessary photoresist left intact is formed on parts of the surface of the epiwafer 1900, for serving as an electron transit region, by use of the lithographic techniques. Oxygen ions are implanted deep into regions (insulation regions) 1932, not covered by the photoresist, through the first buffer layer 1904 and the second buffer layer 1906. The insulation regions 1932 are thus formed, effecting separation between devices.

Figure 35:
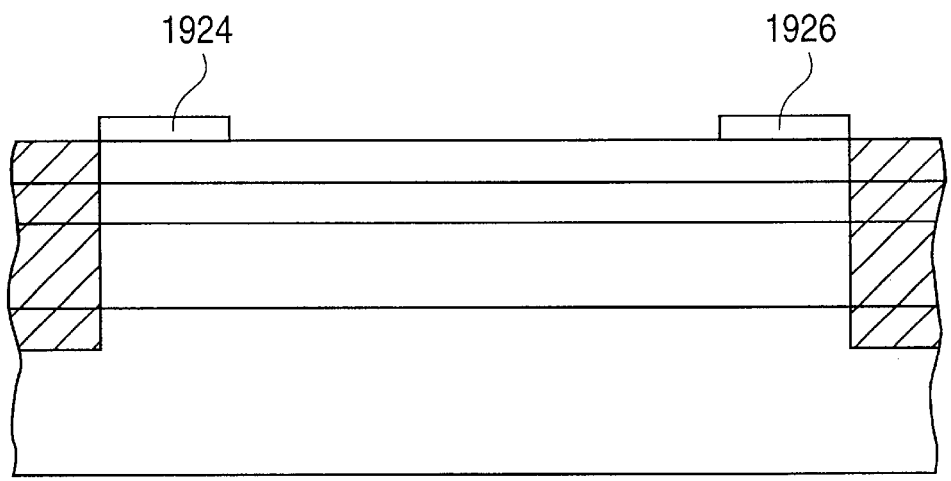
FIG. 35 is a schematic illustration in section of a step of the process of fabricating the semiconductor device, according to the twentieth embodiment of the invention.

Then, after removal of the patterned photoresist 1930, ohmic electrodes 1924, 1926, composed of AuGe, are formed, as shown in FIG. 35, by means of the vacuum evaporation/lift-off method.

Figure 36:
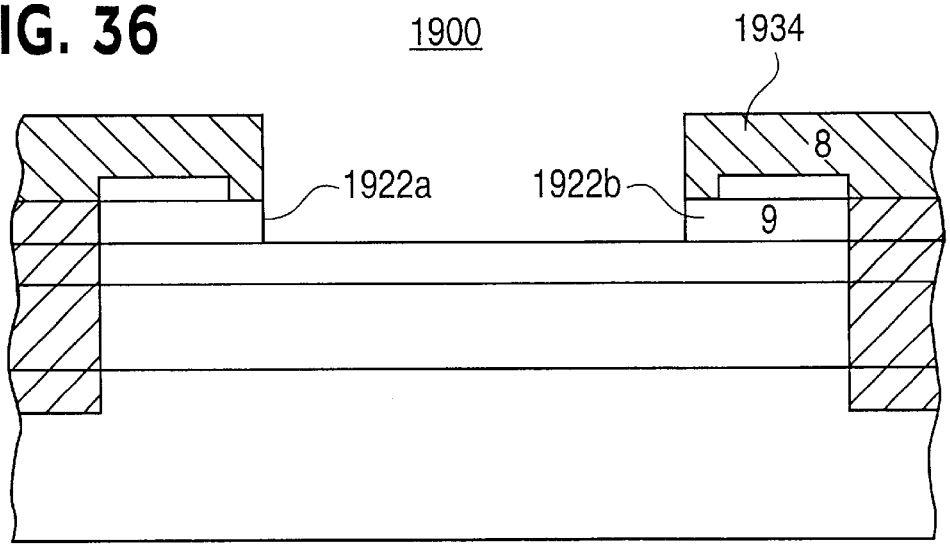
FIG. 36 is a schematic illustration in section of a step of the process of fabricating the semiconductor device, according to the twentieth embodiment of the invention.

Subsequently, as shown in FIG. 36, a patterned photoresist 1934 is formed such that an opening is formed in a region between the ohmic electrodes 1924, and 1926 by means of the lithographic techniques. Using the patterned photoresist 1934 as a mask, the n⁺GaAs layer 1922 is removed by means of the reactive ion etching (RIE) method using a mixed gas containing ¹²carbon. As a result, n⁺ regions 1922a, 1922b are formed in regions for forming a source electrode and a drain electrode, respectively.

Figure 37:
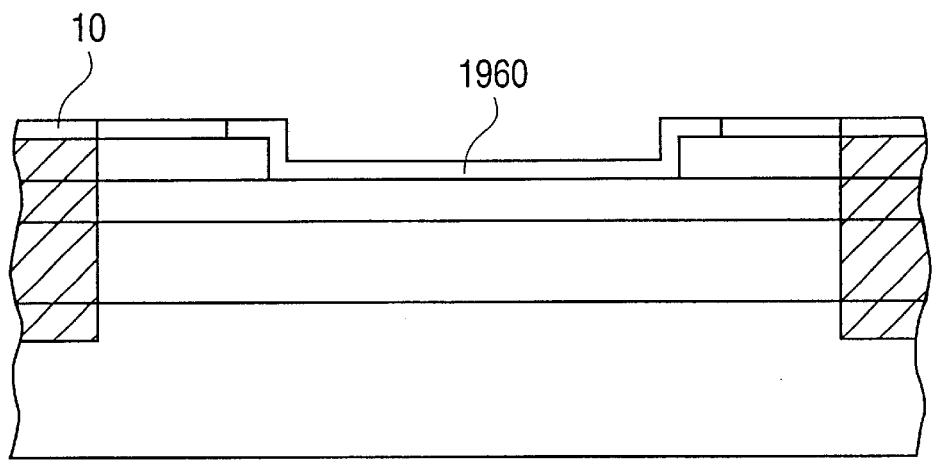
FIG. 37 is a schematic illustration in section of a step of the process of fabricating the semiconductor device, according to the twentieth embodiment of the invention.

Then, after removal of the patterned photoresist 1934, a $SiO_2$ film as a spacer insulation film layer 1960 is deposited across the surface of the wafer. Thereafter, a patterned photoresist (not shown) provided with openings only above the ohmic electrodes 1924, 1926 is formed by use of the photolithographic techniques, and by removing the $SiO_2$ film in unnecessary parts using the patterned photoresist as a mask, a structure in the shape shown in FIG. 37 is obtained.

Figure 38:
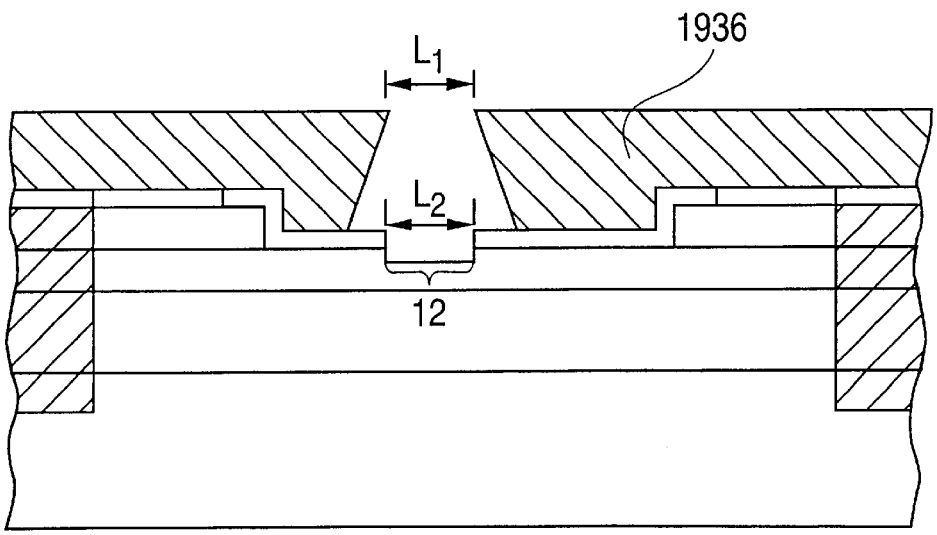
FIG. 38 is a schematic illustration in section of a step of the process of fabricating the semiconductor device, according to the twentieth embodiment of the invention.

Subsequently, using an i-line photoresist FSMR (manufactured by Fuji Chemicals Industrial Co., Ltd), a photoresist 1936 patterned in an overhanging shape in a sectional view as shown FIG. 38 is formed Thereafter, the spacer insulation film layer 1960 is etched over a length L2, about 0.55 μm long, substantially equivalent to a length L1, about 0.5 μm long, of an opening provided in the photoresist, with the use of the reactive ion etching (RIE) system (with the wafer placed on the cathode) using $SF_6$ gas. At this point in time, movement of F ions in plasma is controlled in the vertical direction.

It is desirable to adjust gas pressure in the reaction chamber of the system at about 1 Pa (Pascal) in order to enhance anisotropy in etching.

Figure 39:
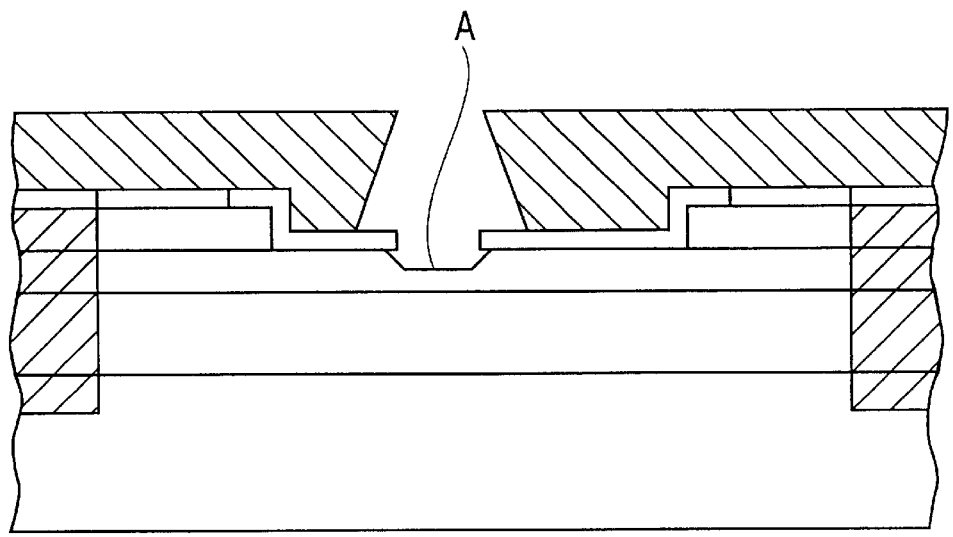
FIG. 39 is a schematic illustration in section of a step of the process of fabricating the semiconductor device, according to the twentieth embodiment of the invention.
Figure 40:
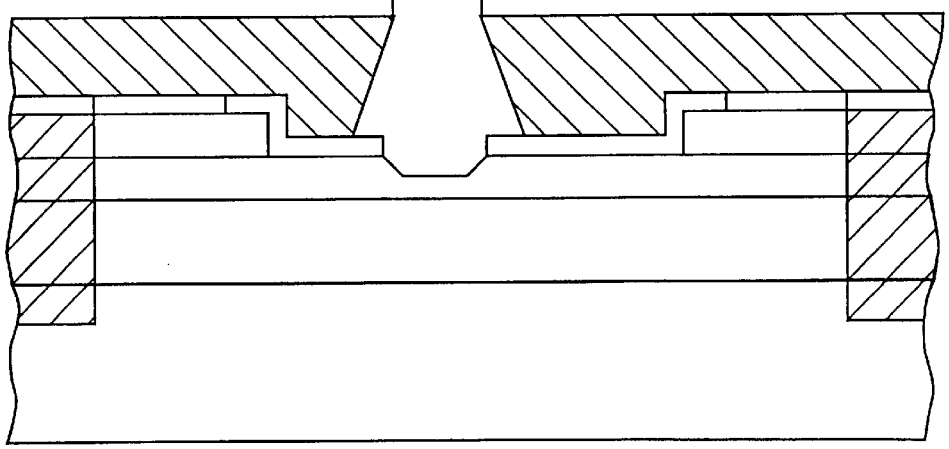
FIG. 40 is a schematic illustration in section of a step of the process of fabricating the semiconductor device, according to the twentieth embodiment of the invention.

Subsequently, by etching the cap layer 1920 using an etchant composed of a mixture of phosphoric acid, and aqueous solution of hydrogen peroxide, a surface A, slowly etched as shown in FIG. 39, is exposed, forming an etching groove in the so-called inverted mesa shape. At this point in time, as the edges of the spacer insulation film layer 1960 will have an overhanging shape, ashing of the patterned photoresist 1936 is performed, thereby widening a length of the opening of the patterned photoresist 1936 to L3. Subsequently, an opening of the spacer insulation film layer 1960 is rendered wider by RIE treatment using $SF_6$. As shown in FIG. 40, the edges of the opening of the spacer insulation film layer 1960 are then made to correspond to the edges of the opening of the cap layer 1920.

Figure 41:
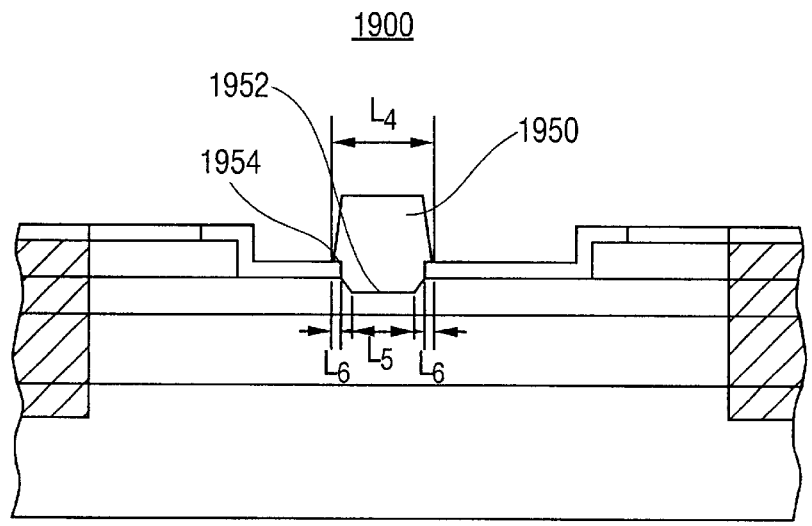
FIG. 41 is a schematic illustration in section of a step of the process of fabricating the semiconductor device, according to the twentieth embodiment of the invention.

Thereafter, a material for the gate electrode 1950 is formed into the shape shown in FIG. 41 by means of the vacuum evaporation/lift-off method The PHEMT 1900 is thus completed. A length L4 between opposite edges of the gate electrode 1950 will become about 0.8 μm because of spreading of an injection angle of an evaporated substance during the vacuum evaporation A length L5 of the bottom 1952 of the gate electrode being about 0.45 μm, the edges 1954 at the upper level of the gate electrode 1950 can have a portion thereof with a length L6 on the order of 0.1 μm on either side, sufficiently long for overlying the cap layer($\Phi^-$GaAs) 1920.

As described in the foregoing, with this embodiment, by anisotropic etching using the patterned photoresist 1936 with the opening for forming the gate electrode 1950 as a mask, an opening of the same dimensions as those of the opening of the patterned photoresist is first formed in the spacer insulation film layer 1960. Further, wet etchingis executed using the patterned photoresist 1936 with the opening such that the inverted mesa appears in the cap layer ($\Phi^-$GaAs) 1920. Thereafter, through ashing of the patterned photoresist, the opening thereof is expanded Subsequently, by anisotropic etching, insulation film remaining on the edges of the spacer insulation film layer 1960 is removed As a result, the edges of the spacer insulation film layer 1960 are rendered flush with the edges of the cap layer ($\Phi^-$GaAs) 1920. Further, using the patterned photoresist 1936 with the opening as a mask again, the gate electrode 1950 is formed by means of the vacuum evaporation/lift-off method.

Thus, with this embodiment, the PHEMT 1900 wherein the Schottky layer ($\Phi$–AlGaAs) 1918, which is chemically unstable, is not allowed at all to be exposed can be fabricated because the edges 1954 at the upper level of the gate electrode 1950 overlie throughout the surface of the cap layer ($\Phi^-$GaAs) 1920.

[Twenty-first Embodiment]

FIGS. 42 through 46 are cross-sectional representations of various steps in a process of fabricating a semiconductor device, according to a twenty-first embodiment of the invention. The twenty-first embodiment relates to a process of fabricating a semiconductor device 2000 having the substantially same construction as that of the PHEMT 1600 according to the seventeenth embodiment of the invention.

First, an epiwafer 2000 with all compound semiconductor layers corresponding to those of the PHEMT 1600 according to the seventeenth embodiment, formed thereon through epitaxial growth, is fabricated on a semi-insulating GaAs substrate 2002 by means of the molecular beam epitaxy (MBE). More specifically, the epiwafer 2000 comprises the semi-insulating GaAs substrate 2002, on top of which a first buffer layer 2004, composed of $\Phi^-$GaAs, a second buffer layer 2006, composed of $\Phi^-$AlGaAs, a fist electron supply layer 2008, composed of $n^+$AlGaAs, a first spacer 2010, composed of $\Phi^-$AlGaAs, a channel layer 2012, composed of $\Phi^-$InGaAs, a second spacer 2014, composed of $\Phi^-$AlGaAs, and a second electron supply layer 2016, composed of $n^+$AlGaAs, a Schottky layer 2018, composed of $\Phi^-$AlGaAs, a cap layer 2020, composed of $\Phi^-$GaAs, and a etch-stop layer 2021, composed of $n^+$AlGaAs, are deposited in that order. Further, on top of the etch-stop layer 2021, a $n^+$GaAs layer 2022 is deposited, making up the uppermost layer. The same treatments as those described in the twentieth embodiment with reference to FIGS. 34 and 35 are applied to the epiwafer 2000.

Figure 42:
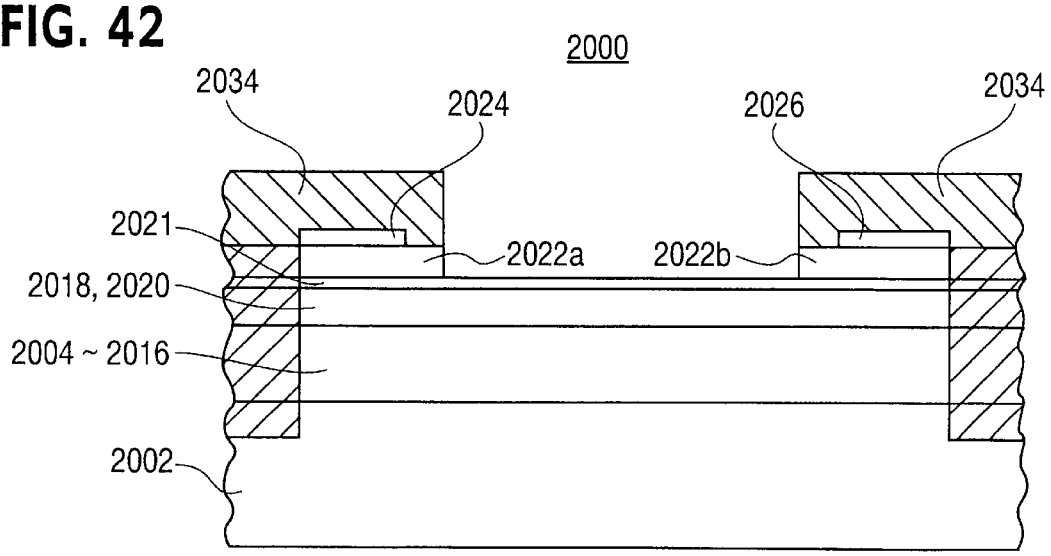
FIG. 42 is a schematic illustration in section of a step of a process of fabricating a semiconductor device, according to a twenty-first embodiment of the invention.

Subsequently, as shown in FIG. 42, a patterned photoresist 2034 is formed such that an opening is formed in a region between ohmic electrodes 2024, and 2026 by means of the lithographic techniques. Using the patterned photoresist 2034 as a mask, the $n^+$GaAs layer 2022 is removed by means of the reactive ion etching (RIE) method. In such etching treatment, a mixed gas A containing $^{12}$carbon is used so as not to remove $n^+$AlGaAs. As a result, $n^+$regions 2022a, 2022b are formed in regions for forming a source electrode and a drain electrode, respectively. A surface exposed by this etching is the etch-stop layer ($n^+$AlGaAs) 2021.

Figure 43:
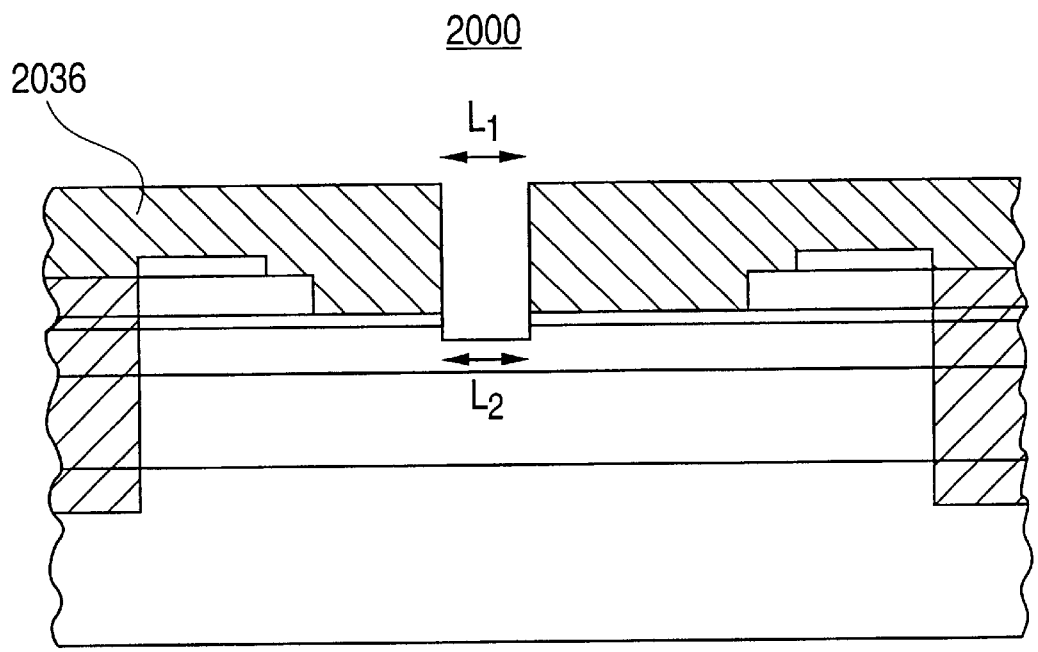
FIG. 43 is a schematic illustration in section of a step of the process of fabricating the semiconductor device, according to the twenty-first embodiment of the invention.

Subsequently, by means of the i-line exposure with a stepper using an i-line positive photoresist (ThMR as trade name, manufactured by Tokyo Ohka Kogyo Co., Ltd), a patterned photoresist 2036 having anopening with a length L1, about 0.3 μm long, as shown in FIG. 43. By reactive ion etching (RIE) using a mixed gas B containing $^{12}$carbon, capable of etching both $\Phi^-$GaAs and $n^+$AlGaAs, and using the patterned photoresist 2036 as a mask, a portion of the etch-stop layer 2021 and the cap layer 2020, respectively, is removed. Thereafter, the cap layer 2020 over a length L2, about 0.35 μm long, substantially equivalent to the length L1, about 0.3 μm long, of the opening of the patterned photoresist 2036 by reactive ion etching (RIE) using the mixed gas A (with the wafer placed on the cathode).

Figure 44:
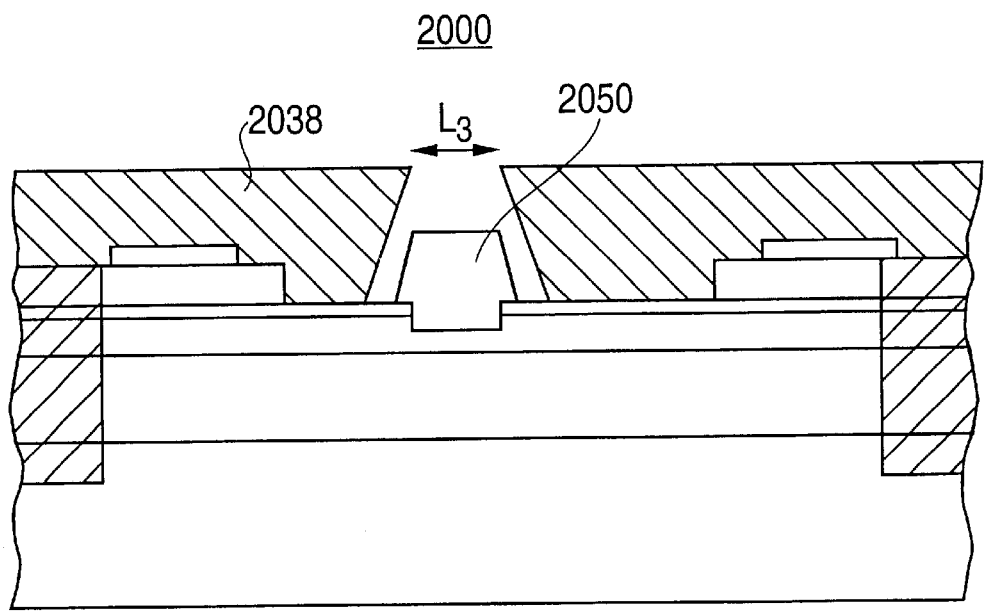
FIG. 44 is a schematic illustration in section of a step of the process of fabricating the semiconductor device, according to the twenty-first embodiment of the invention.

Subsequently, after removal of the patterned photoresist 2036, and cleaning of the wafer 2000, a patterned photoresist 2038 in an overhang shape in section, having an opening with a length L3, about 0.4 μm long, is formed as shown in FIG. 44 by means of the i-line exposure with a stepper using an i-line photoresist FSMR (manufactured by Fuji Chemicals Industrial Co., Ltd.).

Thereafter, a material for a gate electrode 2050 is formed into a shape as shown in FIG. 44 by means of the vacuum evaporation/lift-off method, whereupon the edges of the gate electrode 2050 overlie the etch-stop layer ($n^+$AlGaAs) 2021.

Figure 45:
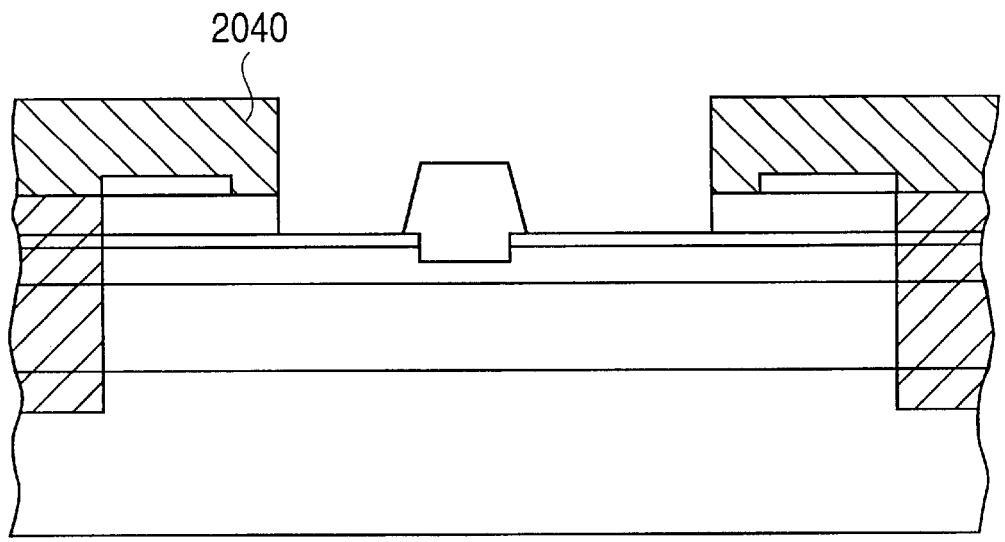
FIG. 45 is a schematic illustration in section of a step of the process of fabricating the semiconductor device, according to the twenty-first embodiment of the invention.
Figure 46:
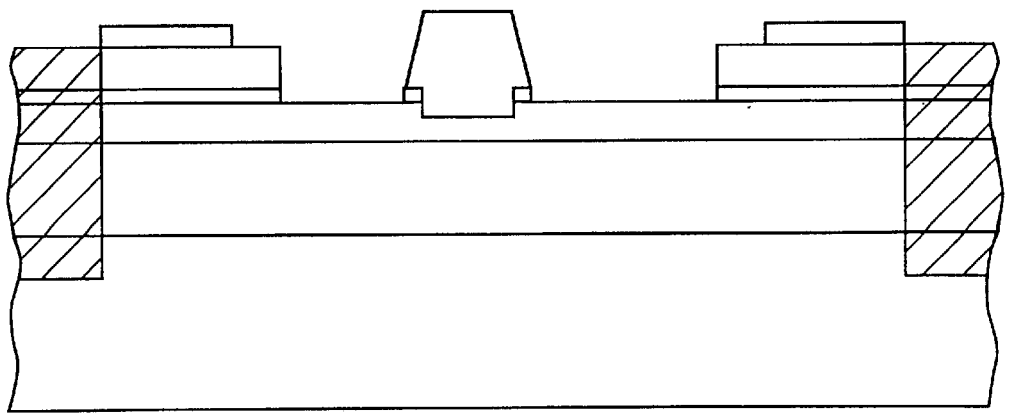
FIG. 46 is a schematic illustration in section of a step of the process of fabricating the semiconductor device, according to the twenty-first embodiment of the invention.

Subsequently, the patterned photoresist 2038 is removed, and a patterned photoresist 2040 is newly formed on the n⁺GaAs layer 2022 as shown in FIG. 45. Thereafter, by applying wet etching, portions of the etch-stop layer 2021, not covered by the gate electrode 2050, are etched Then, by removing the patterned photoresist 2040, the PHEMT 2000 shown in FIG. 46 is completed.

With this embodiment, the etch-stop layer (n⁺AlGaAs) 2021 is formed between the n⁺GaAs layer 2022 and the cap layer 2020, composed of Φ⁻GaAs. Accordingly, during etching of the n⁺GaAs layer, etching of the cap layer (Φ⁻GaAs) is prevented by the etch-stop layer 2021. Thus, with this embodiment, a stable PHEMI having small capacitance Cgs between the gate and the source as well as small capacitance Cgd between the gate and the drain can be fabricated.

A process of fabricating the PHEMT 1500 according to the sixteenth embodiments is the same as that for the PHEMT 100 according to the first embodiment except that a material for the cap layer is changed from n⁺GaAs to Φ⁻GaAs, and the dimensions thereof is changed. Accordingly, description thereof is omitted.

Further, a process of fabricating the PHEMT 1700 according to the eighteenth embodiment is the same as that for the PHEBT 1800 according to the nineteenth embodiment except that anisotropic etching is applied to the cap layer following etching of the spacer insulation film layer.

As described hereinbefore, with the semiconductor device and the process of fabricating same, according to the invention, it is possible to cover the Schottky layer, chemically unstable, with the cap layer, and also to cover boundary regions among the Schottky layer, the cap layer, and the Schottky electrode, that are susceptible to surface defect, with the upper structure of the Schottky electrode.

Thus, the invention can provide a process of fabricating a semiconductor device that is impervious to surface defect, and consequently, high reliable, at a high yield.

Furthermore, the invention makes it possible to form the Schottky ui electrode so as to have a small bottom surface facing electrons in the channel layer.

As a result, high mutual conductance gm, and low capacitance cgs between the gate and the source can be obtained, so that the invention can provide a semiconductor device having a high cut-off frequency fT.

What is claimed is:

1. A semiconductor device comprising:
   a Schottky layer formed over a semiconductor substrate;
   a cap layer comprised of semiconductor material that covers a surface of the Schottky layer, except for including a contact hole that is formed through the cap layer; and
   a Schottky electrode formed on the cap layer and connected to the Schottky layer through the contact hole, the Schottky electrode including an upper portion having a first width and a lower portion having a second width that is smaller than the first width, wherein the lower portion is located in the contact hole.

2. A semiconductor device according to claim 1, further comprising a spacer insulation film layer formed between the Schottky electrode and the cap layer.

3. A semiconductor device according to claim 1, wherein the cap layer includes at least a thinner layer region that contacts the Schottky electrode.

4. A semiconductor device according to claim 1, wherein the cap layer includes at least a thinner layer region on a peripheral side of the Schottky electrode that contacts the upper portion of the Schottky electrode.

5. A semiconductor device according to claim 1, wherein the Schottky electrode is a gate electrode formed between a source electrode and a drain electrode, said gate electrode being set with an offset towards a side of the source electrode.

6. A semiconductor device according to claim 3, wherein the Schottky electrode is a gate electrode formed between a source electrode and a drain electrode, said thinner layer region being formed on both a source electrode side and a drain electrode side of the Schottky electrode symmetrically.

7. A semiconductor device according to claim 3, wherein the Schottky electrode is a gate electrode formed between a source electrode and a drain electrode, said thinner layer region being formed on both a source electrode side and a drain electrode side of the Schottky electrode asymmetrically, said thinner layer region on the drain electrode side being longer than said thinner layer region on the source electrode side.

8. A semiconductor device according to claim 3, wherein the Schottky electrode is a gate electrode formed between a source electrode and a drain electrode, said thinner layer region being formed only on a drain electrode side of the Schottky electrode.

9. A semiconductor device according to claim 1, wherein the Schottky layer is composed of AlGaAs, and the cap layer is composed of GaAs.

10. A semiconductor device according to claim 1, wherein at least a pair of electron supply layers and a channel layer are formed underneath the Schottky layer.

11. A semiconductor device according to claim 1, wherein the cap layer is made of a GaAs layer containing an impurity at a carrier density not more than $1 \times 10^{16}$ cm$^{-3}$.

12. A semiconductor device according to claim 2, wherein the spacer insulation film layer is made of an oxide film.

13. A semiconductor device according to claim 1, wherein the lower portion of the Schottky electrode has a bottom part in contact with the Schottky layer that is shorter in length than a length of an upper part of the lower portion.

14. A semiconductor device comprising:
   a Schottky layer comprised of AlGaAs;
   a cap layer comprised of GaAs and that covers a surface of the Schottky layer, except for including a contact hole that is formed through the cap layer; and
   a Schottky electrode formed on the cap layer and connected to the Schottky layer through the contact hole, the Schottky electrode including an upper portion which has a first width and a lower portion which has a second width that is smaller than the first width, wherein the lower portion is located in the contact hole.

15. The semiconductor device according to claim 14, further comprising a space insulation film layer formed between the Schottky electrode and the cap layer.

16. The semiconductor device according to claim 14, wherein the cap layer includes at least a thinner layer region that contacts the Schottky electrode.

17. The semiconductor device according to claim 14, wherein the cap layer includes at least a thinner layer region on a peripheral side of the Schottky electrode that contacts the upper portion of the Schottky electrode.

18. The semiconductor device according to claim 14, wherein the Schottky electrode is a gate electrode formed between a source electrode and a drain electrode, the gate electrode being set with an offset towards a side of the source electrode.

19. The semiconductor device according to claim 16, wherein the Schottky electrode is a gate electrode formed between a source electrode and a drain electrode, the thinner layer region being formed on both a source electrode side and a drain electrode side of the Schottky electrode symmetrically.

20. The semiconductor device according to claim 16, wherein the Schottky electrode is a gate electrode formed between a source electrode and a drain electrode, the thinner layer region being formed on both a source electrode side and a drain electrode side of the Schottky electrode asymmetrically, the thinner layer region on the drain electrode side being longer than the thinner layer region on the source electrode side.

21. The semiconductor device according to claim 16, wherein the Schottky electrode is a gate electrode formed between a source electrode and a drain electrode, the thinner layer region being formed only on a drain electrode side of the Schottky electrode.

22. The semiconductor device according to claim 15, wherein the spacer insulation film layer is made of an oxide film.

23. The semiconductor device according to claim 14, wherein the lower portion of the Schottky electrode has a bottom part in contact with the Schottky layer, the bottom part having a length that is shorter than a length of an upper part of the lower portion.

24. A semiconductor device comprising:
a Schottky layer formed over a semiconductor substrate;
a cap layer comprised of a semiconductor material and including a contact hole formed therethrough, the cap layer covering a surface of the Schottky layer; and
a Schottky electrode formed on the cap layer and connected to the Schottky layer through the contact hole, the Schottky electrode including an upper portion which has a first width and a lower portion which has a second width that is smaller than the first width, wherein the lower portion is located in the contact hole and wherein the cap layer is contacted with the Schottky electrode.

25. The semiconductor device according to claim 24, further comprising a spacer insulation film layer formed between the Schottky electrode and the cap layer.

26. The semiconductor device according to claim 24, wherein the cap layer includes at least a thinner layer region that contacts the Schottky electrode.

27. The semiconductor device according to claim 24, wherein the cap layer includes at least a thinner layer region on a peripheral side of the Schottky electrode that contacts the upper portion of the Schottky electrode.

28. The semiconductor device according to claim 24, wherein the Schottky electrode is a gate electrode formed between a source electrode and a drain electrode, the gate electrode being set with an offset towards a side of the source electrode.

29. The semiconductor device according to claim 26, wherein the Schottky electrode is a gate electrode formed between a source electrode and a drain electrode, the thinner layer region being formed on both a source electrode side and a drain electrode side of the Schottky electrode symmetrically.

30. The semiconductor device according to claim 26, wherein the Schottky electrode is a gate electrode formed between a source electrode and a drain electrode, the thinner layer region being formed on both a source electrode side and a drain electrode side of the Schottky electrode asymmetrically, the thinner layer region on the drain electrode side being longer than the thinner layer region on the source electrode side.

31. The semiconductor device according to claim 26, wherein the Schottky electrode is a gate electrode formed between a source electrode and a drain electrode, the thinner layer region being formed only on a drain electrode side of the Schottky electrode.

32. The semiconductor device according to claim 25, wherein the spacer insulation film layer is made of an oxide film.

33. The semiconductor device according to claim 24, wherein the lower portion of the Schottky electrode has a bottom part in contact with the Schottky layer, the bottom part having a length that is shorter than a length of an upper part of the lower portion.

* * * * *